United States Patent
Takahashi et al.

(10) Patent No.: US 8,958,255 B2
(45) Date of Patent: Feb. 17, 2015

(54) SEMICONDUCTOR STORAGE APPARATUS WITH A DATA-TO-BE-WRITTEN OUTPUT CIRCUIT FOR CARRYING OUT AN EARLY DATA WRITE

(71) Applicant: Renesas Electronics Corporation, Kawasaki-shi (JP)

(72) Inventors: Hiroyuki Takahashi, Kawasaki (JP); Masahiro Yoshida, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/069,056

(22) Filed: Oct. 31, 2013

(65) Prior Publication Data

US 2014/0133251 A1   May 15, 2014

(30) Foreign Application Priority Data

Nov. 9, 2012   (JP) ................................. 2012-247488

(51) Int. Cl.
*G11C 11/4096*   (2006.01)
*G11C 11/4091*   (2006.01)
*G11C 7/08*   (2006.01)

(52) U.S. Cl.
CPC ........ *G11C 11/4091* (2013.01); *G11C 11/4096* (2013.01); *G11C 7/08* (2013.01)
USPC ............ 365/189.16; 365/189.17; 365/189.08; 365/190; 365/205; 365/206; 365/208; 365/233.16

(58) Field of Classification Search
USPC ............. 365/189.16, 189.17, 189.05, 189.08, 365/190, 205, 206, 208, 233.16, 233.1
See application file for complete search history.

(56) References Cited

U.S. PATENT DOCUMENTS

| 5,233,558 | A | * | 8/1993 | Fujii et al. | ................. 365/189.14 |
| 6,041,004 | A | | 3/2000 | Haga | |
| 6,538,944 | B2 | * | 3/2003 | Choi | ............................ 365/205 |
| 7,336,557 | B2 | * | 2/2008 | Sawada | ...................... 365/233.1 |

FOREIGN PATENT DOCUMENTS

| JP | 4-153987 A | 5/1992 |
| JP | 6-162765 A | 6/1994 |
| JP | 8-96578 A | 4/1996 |
| JP | 10-162577 A | 6/1998 |
| JP | 2000-123574 A | 4/2000 |
| JP | 2003-16783 A | 1/2003 |

* cited by examiner

*Primary Examiner* — Andrew Q Tran
(74) *Attorney, Agent, or Firm* — McGinn IP Law Group, PLLC

(57) ABSTRACT

A semiconductor storage apparatus according to the present invention includes a plurality of memory cells, a plurality of word lines, a plurality of pairs of bit lines, a plurality of sense amplifiers, a pair of common data lines, a data-to-be-written output circuit configured to, in writing data, set voltages of the common data lines forming the pair, a column selection signal output unit configured to output a plurality of column selection signals, and a plurality of column selection gates, in which in writing the data, the column selection signal output unit selectively turns on one of the column selection gates by setting each of voltages of the column selection signals to one of a level of a higher-potential power supply voltage and a level of a lower-potential power supply voltage, before activating the sense amplifiers.

20 Claims, 14 Drawing Sheets

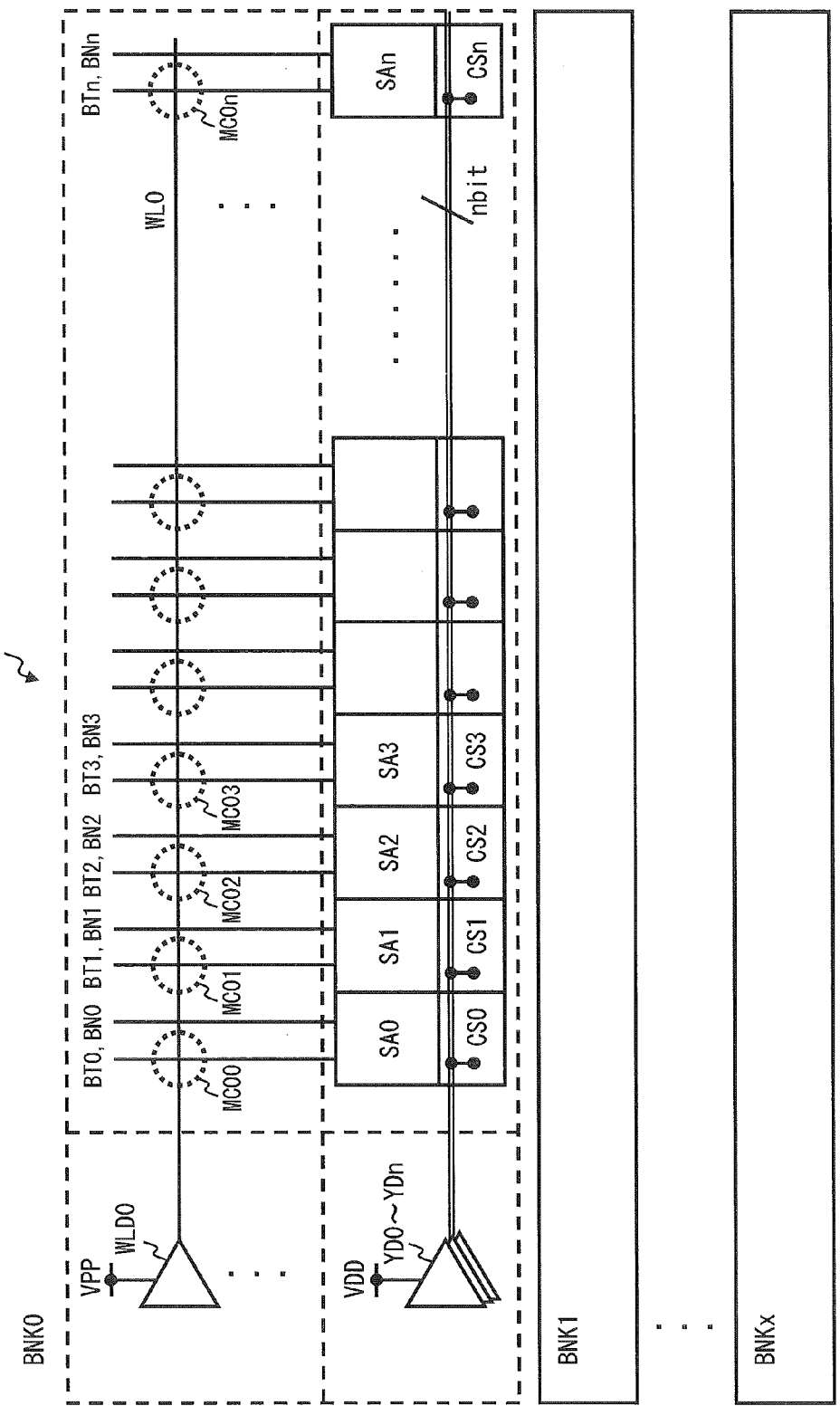

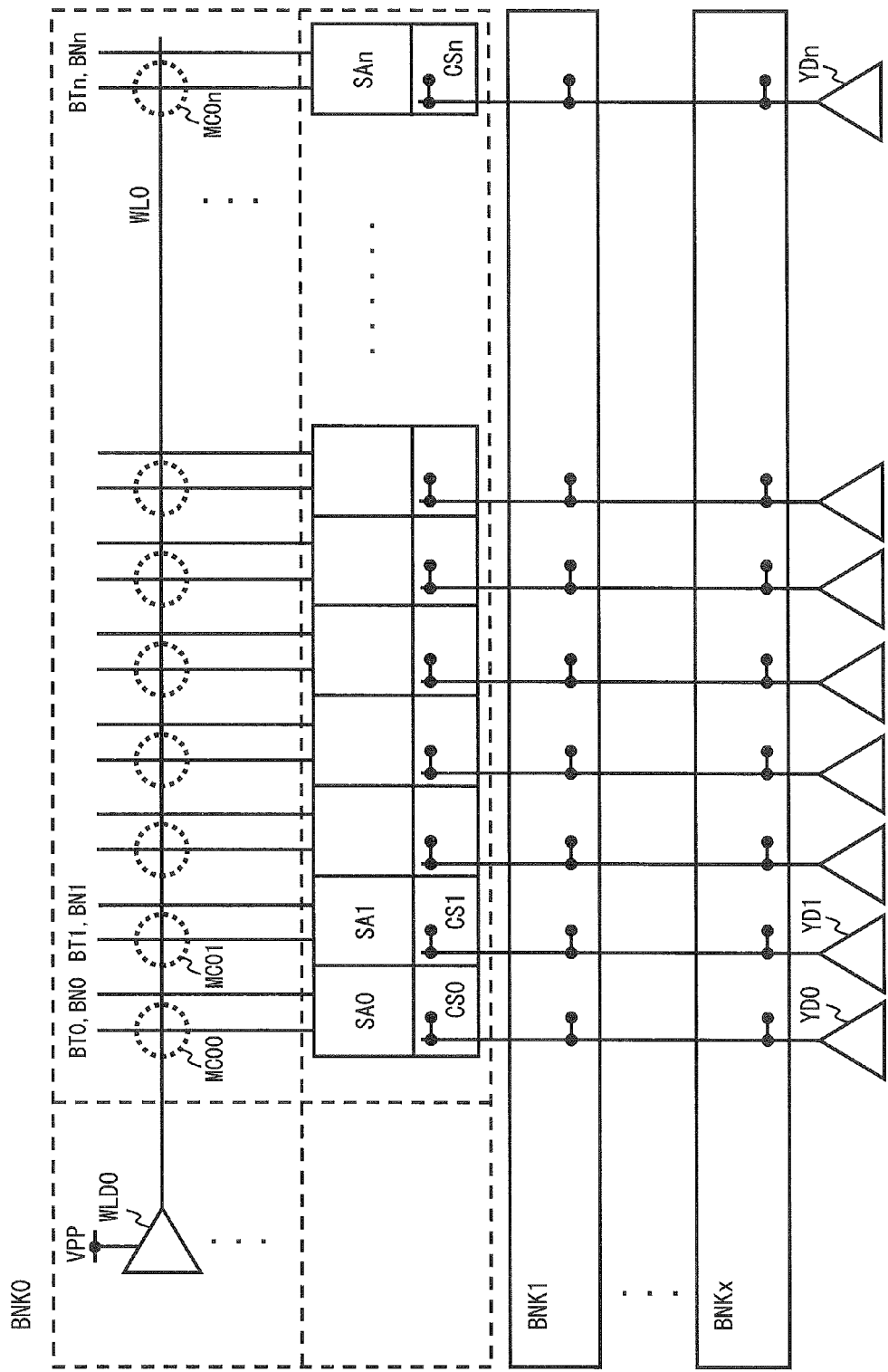

SEMICONDUCTOR STORAGE APPARATUS WITH A DATA-TO-BE-WRITTEN OUTPUT CIRCUIT FOR CARRYING OUT AN EARLY DATA WRITE

CROSS-REFERENCE TO RELATED APPLICATIONS

This application is based upon and claims the benefit of priority from Japanese patent application No. 2012-247488, filed on Nov. 9, 2012, the disclosure of which is incorporated herein in its entirety by reference.

BACKGROUND

The present invention relates to a semiconductor storage apparatus and in particular to a semiconductor storage apparatus which is suitable for a high-speed operation.

Dynamic random access memory (DRAM) has been required to operate faster in recent years. In particular, DRAM has been required to speed up a data write operation, which takes more time than a data read operation or refresh operation. Means for meeting such a requirement are disclosed in Japanese Unexamined Patent Application Publication Nos. 2003-16783 and 10-162577.

A semiconductor storage apparatus disclosed in Japanese Unexamined Patent Application Publication No. 2003-16783 includes a memory cell array having multiple pairs of bit lines BLt/BLc disposed therein, sense amplifiers corresponding to the pairs of bit lines BLt/BLc, column gates corresponding to the pairs of bit lines BLt/BLc and configured to select a column of the memory cell array, and a write buffer circuit configured to hold data to be written to a memory cell. This semiconductor storage apparatus selects a column when the sense amplifiers are inactivated; it writes data to a pair of bit lines BLt/BLc belonging to the selected column when the sense amplifiers are inactivated.

A semiconductor storage apparatus disclosed in Japanese Unexamined Patent Application Publication No. 10-162577 includes a row decoder configured to select a row of a memory cell array, a column selection gate configured to select a column of the memory cell array, a column decoder configured to output a column selection signal to the column selection gate, multiple sense amplifiers connected between the memory cell array and the column selection gate and disposed on the columns of the memory cell array one-on-one, and a sense amplifier control circuit for activating the sense amplifiers. This sense amplifier control circuit activates a sense amplifier corresponding to a column selected by the column selection gate independently of the sense amplifiers on the other columns.

Other related technologies are disclosed in the following Patent Literatures.

A semiconductor storage apparatus disclosed in Japanese Unexamined Patent Application Publication No. 8-96578 includes a transfer gate configured to transfer data between a data latch and a sense amplifier, a transfer gate control circuit configured to control the transfer gate, and a sense amplifier control circuit configured to control the operation of the sense amplifier. In writing data, this semiconductor storage apparatus latches the data in the data latch in advance, controls the transfer gate using the transfer gate control circuit to transfer the data from the data latch to a pair of bit lines, and subsequently activates the sense amplifier using the sense amplifier control circuit.

A memory circuit disclosed in Japanese Unexamined Patent Application Publication No. 4-153987 has a function of writing data simultaneously to multiple memory cells on the same word line using one write buffer. This memory circuit includes a sense amplifier drive circuit configured to inactivate a sense amplifier in writing data.

A semiconductor storage apparatus disclosed in Japanese Unexamined Patent Application Publication No. 6-162765 includes a memory array including perpendicularly disposed multiple word lines and bit lines and memory cells disposed at intersections of the word lines and bit lines in a grid, a common data line to which a specified bit line is selectively connected, and a sense amplifier including multiple unit amplifier circuits corresponding to the bit lines. In a write operation, this semiconductor storage apparatus transmits a write signal to a specified bit line via a common data line and subsequently activates a corresponding unit amplifier circuit.

A semiconductor storage apparatus disclosed in Japanese Unexamined Patent Application Publication No. 2000-123574 includes multiple main sense amplifiers, multiple sub-sense amplifier columns, pairs of main bit lines connecting the main sense amplifiers and the sub-sense amplifier columns, and a memory cell array disposed between the sub-sense amplifier columns. In each pair of main bit lines, main bit lines intersect each other multiple times in such a manner to alternately change the positions thereof and protrude by a length of $\delta$ from a sub-sense amplifier column which is most distant from the main sense amplifiers. $\delta = \gamma - \alpha - \beta$ where $\alpha$ is the length of a main bit line in a main sense amplifier; $\beta$ is the distance between a main sense amplifier and a sub-sense amplifier column closest to the main sense amplifier; and $\gamma$ is the distance between the sub-sense amplifier columns.

SUMMARY

In writing data, the semiconductor storage apparatuses disclosed in Japanese Unexamined Patent Application Publication Nos. 2003-16783 and 10-162577 turn on a column selection gate (column gate) corresponding to the target memory cell to cause a small-amplitude potential difference centered on an intermediate voltage, which is about half the power supply voltage, between bit lines forming a pair connected to the column selection gate, and subsequently activates the sense amplifier.

As the power supply voltage is reduced to 1.2 V or less in recent years, these semiconductor storage apparatuses must provide a voltage greater than the power supply voltage to a column selection gate (column gate) to turn on the column selection gate. Accordingly, these semiconductor storage apparatuses need to separately include a booster circuit for boosting the power supply voltage. Inclusion of such a booster circuit would result in an increase in circuit size.

Other problems and novel features will be apparent from the description of the present specification and the accompanying drawings.

A first aspect of the present invention is a semiconductor storage apparatus including a plurality of memory cells, a plurality of word lines, a plurality of pairs of bit lines, a plurality of sense amplifiers, a pair of common data lines, a data-to-be-written output circuit, a column selection signal output unit, and a plurality of column selection gates, in which in writing the data, the column selection signal output unit selectively turns on one of the column selection gates by setting each of voltages of the column selection signals to one of a level of a higher-potential power supply voltage and a level of a lower-potential power supply voltage, before activating the sense amplifiers.

According to the embodiment, it is possible to provide a semiconductor storage apparatus that can prevent an increase in circuit size and speed up an operation.

BRIEF DESCRIPTION OF THE DRAWINGS

The above and other aspects, advantages and features will be more apparent from the following description of certain embodiments taken in conjunction with the accompanying drawings, in which:

FIG. 13 is a diagram showing a disposition example of a semiconductor storage apparatus according to an eighth embodiment; and FIG. 14 is a diagram showing a disposition example of a semiconductor storage apparatus.

DETAILED DESCRIPTION

Now, embodiments will be described with reference to the accompanying drawings. Since the drawings are illustrative only, the technical scope of the embodiments should not be construed as being limited by the illustrations. The same components are given the same reference signs and will not be described repeatedly.

In the following embodiments, each embodiment is divided into multiple sections or embodiments and then described if necessary for convenience. Unless otherwise specified, the resulting sections or embodiments are not irrelevant of each other, and one is a modification, application, detailed description, supplemental description, or the like of part or all of the other. Further, when the number or the like (including the number of units, a numerical value, an amount, and a range) of components is mentioned in the following embodiments, the number is not limited to a particular number and may be greater or smaller than a particular number, unless otherwise specified or except in a case where the number is apparently limited to a particular number in principle or other cases.

Further, in the following embodiments, the components (including operation steps) are not always essential unless otherwise specified or except in a case where the components are believed to be apparently essential in principle or other cases. Similarly, when the shape, positional relationship, or the like of any component or the like is mentioned in the following embodiments, those substantially approximate or similar to the shape or the like are included unless otherwise specified or except in a case where those are believed not to hold apparently in principle or other cases. This also applies to the number or the like described above (including the number of units, a numerical value, an amount, and a range).

First Embodiment

Figure 1:
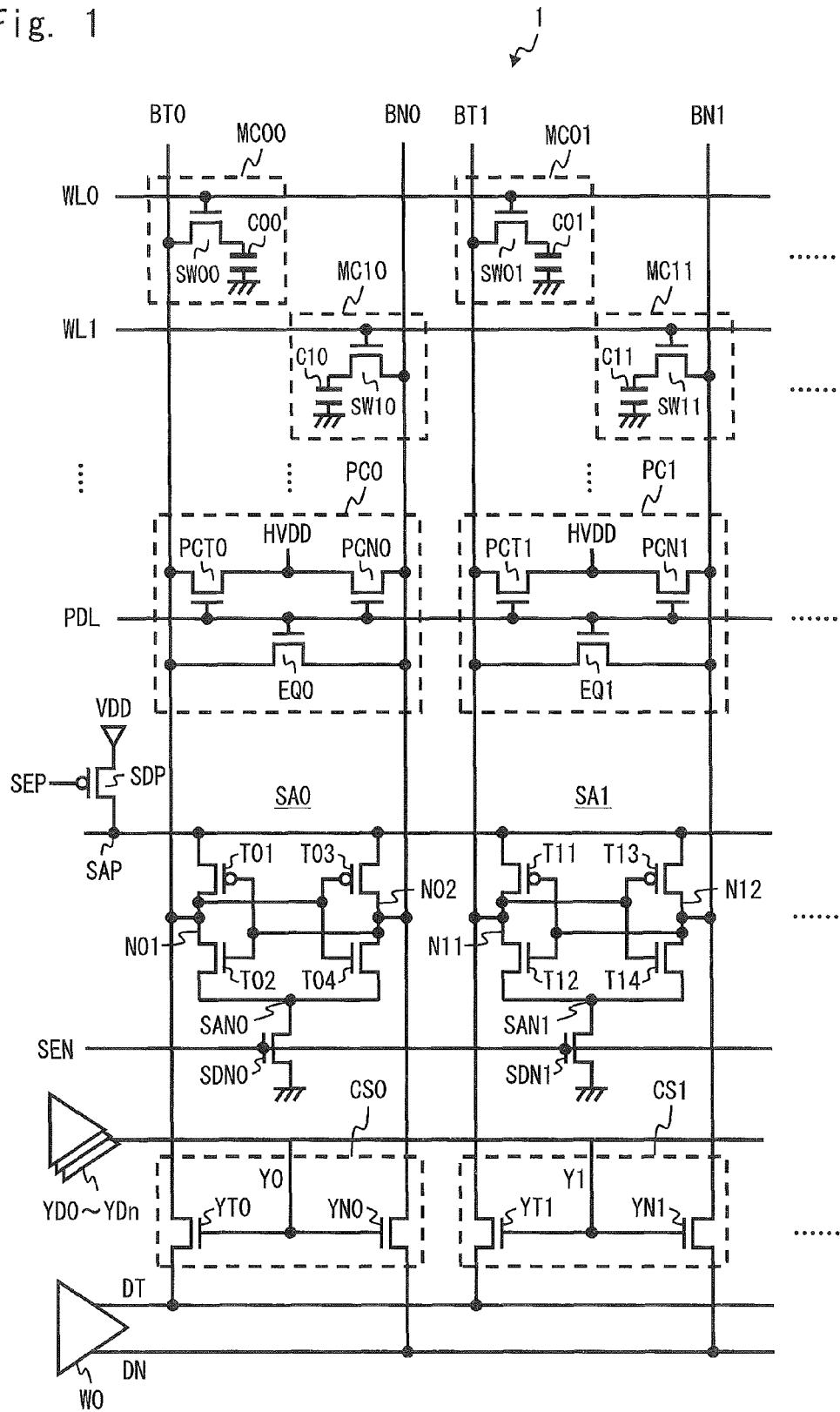
FIG. 1 is a circuit diagram showing an example configuration of a semiconductor storage apparatus according to a first embodiment.

FIG. 1 is a circuit diagram showing an example configuration of a semiconductor storage apparatus 1 according to a first embodiment. The semiconductor storage apparatus 1 according to the present embodiment is, for example, a semiconductor storage apparatus which is driven by a power supply voltage of 1.2 V or less. In writing data, it selectively turns on one of multiple column selection gates by setting the voltages of multiple column selection signals to the power supply voltage or ground voltage, before activating multiple sense amplifiers. Note that the voltage of one of a pair of common data lines DT and DN is previously set to a ground voltage GND on the basis of the data. Thus, the semiconductor storage apparatus 1 according to the present embodiment does not need to include a booster circuit for turning on a column selection gate and therefore can prevent an increase in circuit size and speed up an operation. A detailed description will be made.

In the present embodiment, assume that a power supply voltage (higher-potential power supply voltage) VDD is a relatively low voltage (for example, a voltage of 1.2 V or less). Further, the present embodiment employs a method of writing data to a corresponding pair of bit lines before activating sense amplifiers (early write method).

The semiconductor storage apparatus 1 shown in FIG. 1 is a so-called DRAM apparatus and includes at least multiple memory cells MC00 to MCmn (m and n are natural numbers) which are arranged in a matrix, multiple word lines WL0 to WLm corresponding to the rows of the memory cells (the horizontal direction of FIG. 1), multiple pairs of bit lines BT0 and BN0 to BTn and BNn corresponding to the columns of the memory cells (the vertical direction of FIG. 1), multiple pre-charge circuits PC0 to PCn, multiple sense amplifiers SA0 to SAn, a sense amplifier PMOS driver (second switching element) SDP0, multiple sense amplifier NMOS drivers (first switching elements) SDN0 to SDNn, multiple column selection gates CS0 to CSn, the pair of common data lines DT and DN, a data-to-be-written output circuit WO, and column selection drivers (column selection signal output circuits) YD0 to YDn. The column selection drivers YD0 to YDn constitute a column selection signal output unit. Note that components which are not shown in FIG. 1 include a selection circuit configured to select a memory cell from or to which data is to be read or written by selecting any pair of bit lines and any word line. To simplify the description, assume that m=1 and n=1.

The memory cells MC00 to MC11 each include one capacitor and one transistor (n-channel MOS transistor). Specifically, the memory cell MC00 includes a capacitor C00 and a transistor SW00. The memory cell MC10 includes a capacitor C10 and a transistor SW10. The memory cell MC01 includes a capacitor C01 and a transistor SW01. The memory cell MC11 includes a capacitor C11 and a transistor SW11.

In the memory cell MC00, one end of the capacitor C00 is connected to a ground voltage terminal to which the ground voltage GND (lower-potential power supply voltage) is provided (lower-potential power supply voltage terminal; hereafter referred to as the ground voltage terminal GND), and the other end thereof to one end (source) of the transistor SW00. Another end (drain) of the transistor SW00 is connected to a bit line BT0, and a control end (gate) thereof to the word line WL0. In the memory cell MC10, one end of the capacitor C10 is connected to a ground voltage terminal GND, and the other end thereof to one end (source) of the transistor SW10. Another end (drain) of the transistor SW10 is connected to the bit line BN0, and a control end (gate) thereof to the word line WL1. In the memory cell MC01, one end of the capacitor C01 is connected to a ground voltage terminal GND, and the other end thereof to one end (source) of the transistor SW01. Another end (drain) of the transistor SW01 is connected to the bit line BT1, and a control end (gate) thereof to the word line WL0. In the memory cell MC11, one end of the capacitor C11 is connected to a ground voltage terminal GND, and the other end thereof to one end (source) of the transistor SW11. Another end (drain) of the transistor SW11 is connected to the bit line BN1, and a control end (gate) thereof is connected to the word line WL1. One end of each capacitor need not necessarily be connected to a ground voltage terminal GND and may be connected to a power supply terminal to which an intermediate voltage HVDD, which is about half the power supply voltage VDD (the average of the power supply voltage VDD and the ground voltage GND), is provided (hereafter referred to as a power supply voltage terminal HVDD).

The pre-charge circuit PC0 is a circuit for pre-charging the pair of bit lines BT0 and BN0 to a predetermined voltage (in this case, the intermediate voltage HVDD). The pre-charge circuit PC0 includes transistors PCT0, PCN0, and EQ0. In this embodiment, assume that the transistors PCT0, PCN0, and EQ0 are n-channel MOS transistors. The transistor PCT0 is disposed between the bit line BT0 and a power supply voltage terminal HVDD. The transistor PCN0 is disposed between the bit line BN0 and the power supply voltage terminal HVDD. The transistor EQ0 is disposed between the bit lines BT0 and BN0. The transistors PCT0, PCN0, and EQ0 receive a pre-charge signal PDL at the gates thereof.

The pre-charge circuit PC1 is a circuit for pre-charging the pair of bit lines BT1 and BN1 to a predetermined voltage (in this case, the intermediate voltage HVDD). The pre-charge circuit PC1 includes transistors PCT1, PCN1, and EQ1. In this embodiment, assume that the transistors PCT1, PCN1, and EQ1 are n-channel MOS transistors. The transistor PCT1 is disposed between the bit line BT1 and a power supply voltage terminal HVDD. The transistor PCC1 is disposed between the bit line BN1 and the power supply voltage terminal HVDD. The transistor EQ1 is disposed between the bit lines BT1 and BN1. The transistors PCT1, PCN1, and EQ1 receive pre-charge signals PDL at the gates thereof.

For example, when the pre-charge signal PDL is at an H level, all the transistors PCT0, PCT1, PCN0, PCN1, EQ0, and EQ1 are turned on, so that both the pair of bit lines BT0 and BN0 and the pair of bit lines BT1 and BN1 are pre-charged to the intermediate voltage HVDD. In contrast, when the pre-charge signal PDL is at an L level, all the transistors PCT0, PCT1, PCN0, PCN1, EQ0, and EQ1 are turned off, so that none of the pair of bit lines BT0 and BN0 and the pair of bit lines BT1 and BN1 is pre-charged.

The sense amplifier SA0 is a circuit for amplifying the potential difference between the bit lines BT0 and BN0 forming a pair. The sense amplifier SA0 includes transistors T01 to T04. In the present embodiment, assume that the transistors T01 and T03 are p-channel MOS transistors and that the transistors T02 and T04 are n-channel MOS transistors. The source of the transistor T01 is connected to a node SAP; the drain thereof to a node N01; and the gate thereof to a node N02. The source of the transistor T02 is connected to a node SAN0; the drain thereof to the node N01; and the gate thereof to the node N02. The source of the transistor T03 is connected to the node SAP; the drain thereof to the node N02; and the gate thereof to the node N01. The source of the transistor T04 is connected to the node SAN0; the drain thereof to the node N02; and the gate thereof to the node N01. The node N01 is also connected to the bit line BT0. The node N02 is also connected to the bit line BN0. The transistors T01 and T02 constitute a first inverter; the transistors T03 and T04 constitute a second inverter. The output of the first inverter (N01) is connected to the input of the second inverter and to the bit line BT0; the output of the second inverter (N02) is connected to the input of the first inverter and to the bit line BN0.

The sense amplifier SA1 is a circuit for amplifying the potential difference between the bit lines BT1 and BN1 forming a pair. The sense amplifier SA1 includes transistors T11 to T14. In the present embodiment, assume that the transistors T11 and T13 are p-channel MOS transistors and that the transistors T12 and T14 are n-channel MOS transistors. The source of the transistor T11 is connected to the node SAP; the drain thereof to a node N11; and the gate thereof to a node N12. The source of the transistor T12 is connected to a node SAN1; the drain thereof to the node N11; and the gate thereof to the node N12. The source of the transistor T13 is connected to the node SAP; the drain thereof to the node N12; and the gate thereof to the node N11. The source of the transistor T14 is connected to the node SAN1; the drain thereof to the node N12; and the gate thereof to the node N11. The node N11 is also connected to the bit line BT1. The node N12 is also connected to the bit line BN1. The transistors T11 and T12 constitute a first inverter; the transistors T13 and T14 constitute a second inverter. The output of the first inverter (N11) is connected to the input of the second inverter and to the bit line BT1; the output of the second inverter (N12) is connected to the input of the first inverter and to the bit line BN1.

A sense amplifier PMOS driver SDP is disposed between the node SAP and a power supply voltage terminal to which the power supply voltage VDD is provided (higher-potential power supply voltage terminal; hereafter referred to as a power supply voltage terminal VDD). The sense amplifier PMOS driver SDP is turned on or off based on a sense amplifier activation signal SEP outputted from a sense amplifier control circuit (not shown). In this embodiment, assume that the sense amplifier PMOS driver SDP is a p-channel MOS transistor. That is, the sense amplifier PMOS driver SDP serving as a common switching element is disposed between the sense amplifiers SA0 and SA1 and the power supply voltage VDD.

A sense amplifier NMOS driver SDN0 is disposed between the node SAN0 and a ground voltage terminal GND and turned on or off based on a sense amplifier activation signal SEN outputted from a sense amplifier control circuit (not shown). A sense amplifier NMOS driver SDN1 is disposed between the node SAN1 and a ground voltage terminal GND and turned on or off based on a sense amplifier activation signal SEN. In this embodiment, assume that the sense amplifier NMOS drivers SDN0 and SDN1 are n-channel MOS transistor. That is, the sense amplifier NMOS drivers SDN0 and SDN1 serving as separate switching elements are disposed between the sense amplifiers SA0 and SA1 and the ground voltage terminals GND.

For example, when the sense amplifier activation signal SEP is at an L level and when the sense amplifier activation signals SEN are at an H level, the sense amplifier PMOS driver SDP and the sense amplifier NMOS drivers SDN0 and SDN1 are all turned on. Thus, the sense amplifiers SA0 and SA1 are both activated and then amplify the potential difference between the bit lines BT0 and BN0 forming a pair and the potential difference between the bit lines BT1 and BN1 forming a pair, respectively. In contrast, when the sense amplifier activation signal SEP is at an H level and when the sense amplifier activation signals SEN are at an L level, the sense amplifier PMOS driver SDP and the sense amplifier NMOS drivers SDN0 and SDN1 are all turned off. Thus, the sense amplifiers SA0 and SA1 are both inactivated and do not perform an amplification operation. Note that the voltages of the sense amplifier activation signals SEN and SEP complementarily switch between an H level and an L level.

The column selection gate CS0 switches between the connections between the bit lines BT0 and BN0 forming a pair and the common data lines DT and DN forming a pair. The column selection gate CS0 includes transistors YT0 and YN0. In this embodiment, assume that the transistors YT0 and YN0 are n-channel MOS transistors. The source of the transistor YT0 is connected to the common data line DT, and the drain thereof to the bit line BT0. The transistor YT0 receives a column selection signal Y0 at the gate thereof. The source of the transistor YN0 is connected to the common data line DN, and the drain thereof to the bit line BN0. The transistor YN0 receives a column selection signal Y0 at the gate thereof.

The column selection gate CS1 switches between the connections between the bit lines BT1 and BN1 forming a pair and the common data lines DT and DN forming a pair. The column selection gate CS1 includes transistors YT1 and YN1. In this embodiment, assume that the transistors YT1 and YN1 are n-channel MOS transistors. The transistor YT1 has a source connected to the common data line DT, a drain connected to the bit line BT1, and a gate to which a column selection signal Y1 is provided. The transistor YN1 has a source connected to the common data line DN, a drain connected to the bit line BN1, and a gate to which a column selection signal Y1 is provided.

The column selection drivers YD0 and YD1 output the column selection signals Y0 and Y1, respectively. In turning on the column selection gate CS0, the column selection driver YD0 sets the voltage of the column selection signal Y0 to the level of the power supply voltage VDD (hereafter simply referred to as an H level); in turning off the column selection gate CS0, it sets the voltage of the column selection signal Y0 to the level of the ground voltage GND (hereafter simply referred to as an L level). Similarly, in turning on the column selection gate CS1, the column selection driver YD1 sets the voltage of the column selection signal Y1 to an H level; in turning off the column selection gate CS1, it sets the voltage of the column selection signal Y1 to an L level.

For example, when the column selection gate Y0 is at an H level and when the column selection gate Y1 is at an L level, the column selection gate CS0 is turned on and the column selection gate CS1 is turned off. More specifically, electrical connection is made at least between one common data line indicating the level of the ground voltage GND of the pair of common data lines DT and DN and the corresponding bit line of the pair of bit lines BT0 and BN0 (details will be described later). The common data lines DT and DN forming a pair and the bit lines BT1 and BN1 forming a pair are electrically disconnected from each other.

In writing data, the data-to-be-written output circuit WO sets the voltages of the common data lines DT and DN forming a pair to values corresponding to the data. For example, in writing data "0" to the memory cell MC00, the data-to-be-written output circuit WO sets the voltage of the common data line DT to the level of the ground voltage GND and sets the voltage of the common data line DN to the level of the intermediate voltage HVDD. In contrast, in writing data "1" to the memory cell MC00, the data-to-be-written output circuit WO sets the voltage of the common data line DN to the level of the ground voltage GND and sets the voltage of the common data line DT to the level of the intermediate voltage HVDD.

In the present embodiment, the example has been described in which the data-to-be-written output circuit WO sets the voltage of one of the pair of common data lines DT and DN to the level of the ground voltage GND and sets the voltage of the other to the intermediate voltage HVDD; however, the present embodiment is not limited to this example. The data-to-be-written output circuit WO only has to set the voltage of one of the pair of common data lines DT and DN to a value lower than a voltage obtained by subtracting the threshold voltage of the n-channel MOS transistors YT0 and YN0 from the power supply voltage VDD and to set the voltage of the other common data line to a level higher than the voltage of the one common data line. As the voltage of one of the pair of common data lines comes closer to the level of the ground voltage GND, it is possible to write data faster and to obtain a larger operation margin. On the other hand, as the voltage of one of the pair of common data lines becomes higher than the ground voltage GND, the potential difference between the common data lines forming a pair becomes smaller. As a result, noise between unselected bit lines forming a pair is suppressed.

Figure 2:
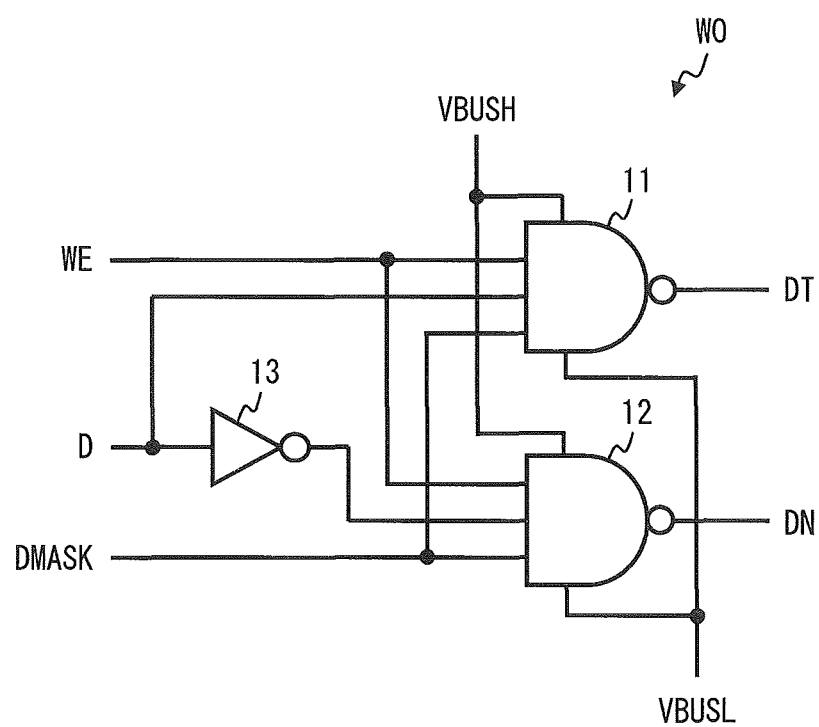
FIG. 2 is a diagram showing an example configuration of a data-to-be-written output circuit included in the semiconductor storage apparatus according to the first embodiment.

FIG. 2 is a diagram showing a specific configuration example of the data-to-be-written output circuit WO. The data-to-be-written output circuit WO shown in FIG. 2 includes NAND circuits 11 and 12 and an inverter circuit (hereafter simply referred to as the INV circuit) 13.

The data-to-be-written output circuit WO receives, for example, a write enable signal WE, data D to be written, and a data mask signal DMASK for masking data to be written. The data-to-be-written output circuit WO also receives a higher-potential power supply voltage VBUSH and a lower-potential power supply voltage VBUSL. The lower-potential power supply voltage VBUSL is a relatively low voltage adjacent to the ground voltage GND and is preferably approximately identical to the ground voltage GND. Accordingly, the lower-potential power supply voltage VBUSL may be the ground voltage GND. The lower-potential power supply voltage VBUSL is provided to the respective lower-potential power supply terminals of the NAND circuits 11 and 12. The higher-potential power supply voltage VBUSH is higher than at least the lower-potential power supply voltage VBUSL and is, for example, approximately identical to the intermediate voltage HVDD. Accordingly, the higher-potential power supply voltage VBUSH may be the intermediate voltage HVDD. The higher-potential power supply voltage VBUSH is provided to the respective higher-potential power supply terminals of the NAND circuits 11 and 12.

The NAND circuit 11 outputs the NAND of the write enable signal WE, the data D to be written, and the data mask signal DMASK to the common data line DT. The NAND circuit 12 outputs the NAND of the write enable signal WE, an inverted signal of the data D to be written, and the data mask signal DMASK to the common data line DN. The NAND circuits 11 and 12 each output a signal having the level of the lower-potential power supply voltage VBUSL as an L-level signal and a signal having the level of the higher-potential power supply voltage VBUSH as an H-level signal.

Next, a data write operation of the semiconductor storage apparatus 1 will be described. Before describing an early write-type data write operation of the semiconductor storage apparatus 1, a normal data write operation will be described for comparison.

Figure 3:
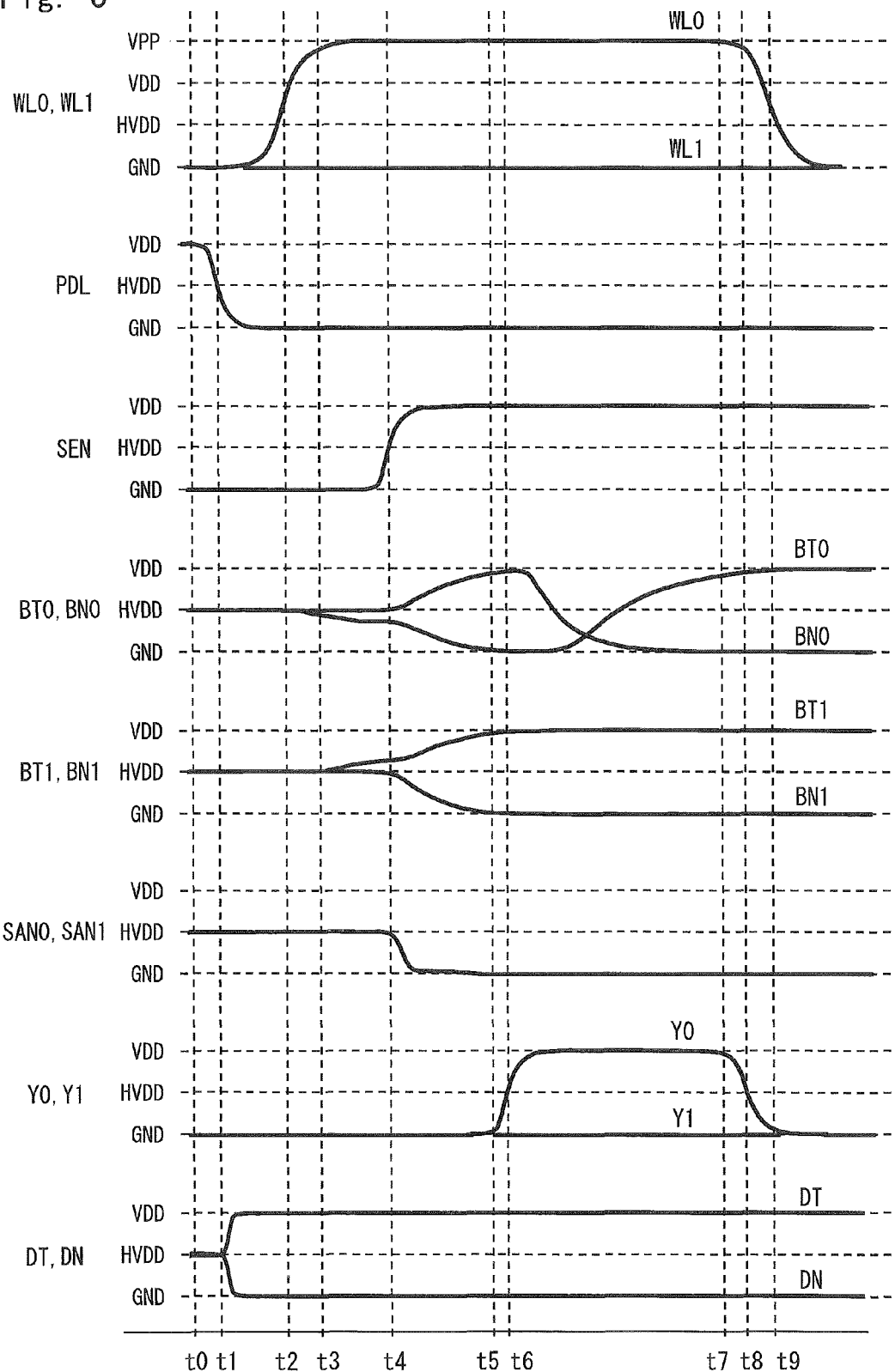
FIG. 3 is a timing chart showing a normal data write operation of the semiconductor storage apparatus shown in FIG. 1.

FIG. 3 is a timing chart showing a normal data write operation of the semiconductor storage apparatus 1. An example will be described in which data "1" is written to the target memory cell, MC00. In this example, it is assumed that data "0" is previously stored in the memory cell MC00 and data "1" is previously stored in the memory cell MC01. Furthermore, for the sake of convenience, it is also assumed that the data-to-be-written output circuit WO outputs a signal having the level of the ground voltage GND as an L-level signal and outputs a signal having the level of the power supply voltage VDD as an H-level signal.

Initially (at time t0), the pre-charge signal PDL is at an H level and therefore both the pair of bit lines BT0 and BN0 and the pair of bit lines BT1 and BN1 are pre-charged to the intermediate voltage HVDD. Both the word lines WL0 and WL1 indicate an L level. The sense amplifier activation signal SEN is at an L level, and the sense amplifier activation signal SEP is at an H level (only SEN is shown in FIG. 3). Accordingly, both the sense amplifiers SA0 and SA1 are inactivated, and the nodes SAN0 and SAN1 are floating. The common data lines DT and DN forming a pair indicate the level of the intermediate voltage HVDD. Both the column selection signals Y0 and Y1 are at an L level and therefore both the column selection gates CS0 and CS1 are off. That is, the common data lines DT and DN forming a pair and the bit lines BT0 and BN0 forming a pair are electrically disconnected from each other.

First, in accordance with the data to be written, "1," the common data line DT indicates the level of the power supply voltage VDD, and the common data line DN indicates the level of the ground voltage GND. The pre-charge signal PDL makes a transition from an H level to an L level (falling edge) (time t1). Subsequently, the voltage of the word line WL0 connected to the target memory cell MC00 makes a transition from an L level to an H level (rising edge) (time t2). Thus, the transistor SW00 is turned on, so that charge sharing occurs between the capacitor C00, in which the data "0" is stored, and the bit line BT0. As a result, the voltage of the bit line BT0 starts falling slightly from the intermediate voltage HVDD (time t3). The transistor SW01, which is included in a non-target memory cell, MC01, is also turned on, so that charge sharing occurs between the capacitor C01, in which the data "1" is stored, and the bit line BT1. Thus, the voltage of the bit line BT1 starts rising slightly from the intermediate voltage HVDD (time t3).

When the voltage of the bit line BT0 further falls and thus the potential difference between the bit lines BT0 and BN0 forming a pair is sufficiently increased (in other words, the voltage of the bit line BT1 further rises and thus the potential difference between the bit lines BT1 and BN1 forming a pair is sufficiently increased), the sense amplifier activation signal SEN rises and the sense amplifier activation signal SEP falls (time t4). Thus, the sense amplifiers SA0 and SA1 are both activated and then start amplifying the potential difference between the bit lines BT0 and BN0 forming a pair and the potential difference between the bit lines BT1 and BN1 forming a pair, respectively. At this time, both the voltages of the nodes SAN0 and SAN1 fall to the level of the ground voltage GND.

Through the amplification operation, the sense amplifier SA0 lowers the voltage of the bit line BT0 to the level of the ground voltage GND and raises the voltage of the bit line BN0 to the level of the power supply voltage VDD (time t5). On the other hand, through the amplification operation, the sense amplifier SA1 raises the voltage of the bit line BT1 to the level of the power supply voltage VDD and lowers the voltage of the bit line BN1 to the level of the ground voltage GND.

Subsequently, the column selection signal Y0 rises, and the column selection signal Y1 maintains an L level (time t6). Thus, the column selection gate CS0 is turned on and the column selection gate CS1 remains off. More specifically, electrical connection is made at least between the common data line DN indicating the level of the ground voltage GND and the bit line BN0. The common data lines DT and DN forming a pair and the bit lines BT1 and BN1 forming a pair remain electrically disconnected from each other.

Subsequently, the sense amplifier SA0 performs an amplification operation to invert the voltages of the bit lines BT0 and BN0 forming a pair (time t7). Specifically, the voltage of the bit line BT0 is inverted from the level of the ground voltage GND to the level of the power supply voltage VDD, and the voltage of the bit line BN0 is inverted from the level of the power supply voltage VDD to the level of the ground voltage GND. As a result, the data "1" is written to the memory cell MC00. On the other hand, the read data "1" is written to the memory cell MC01 again.

Subsequently, the column selection signal Y0 falls (time t8) and the word line WL0 falls (time t9). Thus, the normal data write is complete.

Next, an early write-type data write operation of the semiconductor storage apparatus 1 will be described. Note that the semiconductor storage apparatus 1 according to the present embodiment writes data using the early write method rather than using the normal method shown in FIG. 3.

Figure 4:
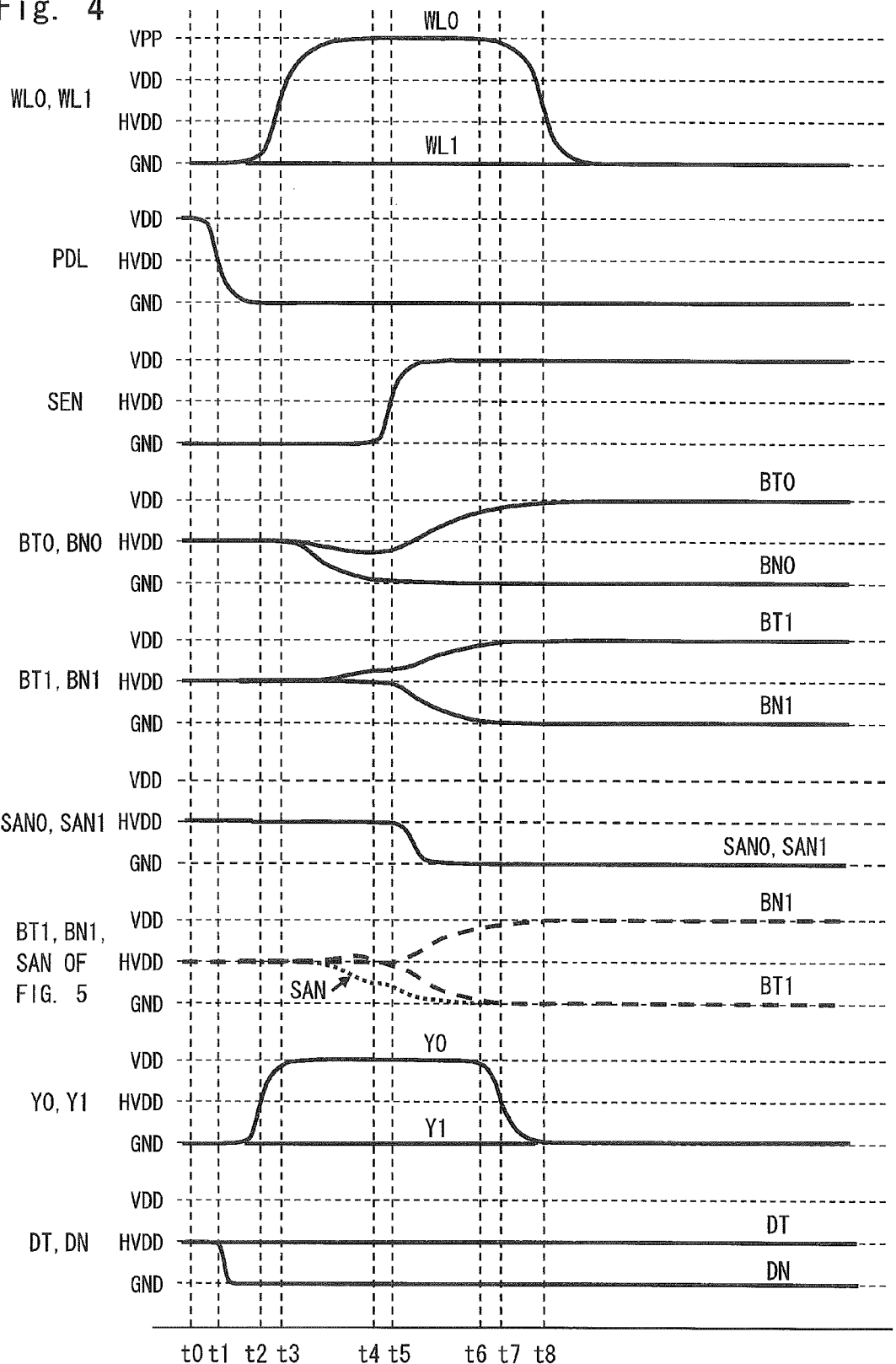
FIG. 4 is a timing chart showing a data write operation of the semiconductor storage apparatus according to the first embodiment.

FIG. 4 is a timing chart showing an early write-type data write operation of the semiconductor storage apparatus 1. An example will be described in which data "1" is written to the target memory cell, MC00. In this example, it is assumed that data "0" is previously stored in the memory cell MC00 and that data "1" is previously stored in the memory cell MC01. As described above, the data-to-be-written output circuit WO outputs a signal having a voltage close to the ground voltage GND as an L-level signal and outputs a signal having the level of the intermediate voltage HVDD as an H-level signal.

Initially (at time t0), the pre-charge signal PDL is at an H level and therefore the bit lines BT0 and BN0 forming a pair and the bit lines BT1 and BN1 forming a pair are all pre-charged to the intermediate voltage HVDD. Both the word lines WL0 and WL1 indicate an L level. The sense amplifier activation signal SEN is at an L level, and the sense amplifier activation signal SEP is at an H level (only SEN is shown in FIG. 4). Accordingly, both the sense amplifiers SA0 and SA1 are inactivated, and the nodes SAN0 and SAN1 are floating. Both the common data lines DT and DN forming a pair indicate the level of the intermediate voltage HVDD. Both the column selection signals Y0 and Y1 are at an L level. Accordingly, both the column selection gates CS0 and CS1 are off. That is, no electrical connection exists between the common data lines DT and DN forming a pair, and the bit lines BT0 and BN0 forming a pair and the bit lines BT1 and BN1 forming a pair.

First, in accordance with the data to be written, "1," the voltage of the common data line DN is lowered to the level of the ground voltage GND. On the other hand, the voltage of the common data line DT maintains the level of the intermediate voltage HVDD. The pre-charge signal PDL falls (time t1). Subsequently, before the sense amplifiers SA0 and SA1 are activated, the column selection signal Y0 rises, and the column selection signal Y1 maintains an L level (time t2). Thus, the column selection gate CS0 is turned on, and the column selection gate CS1 remains off. More specifically, electrical connection is made at least between the common data line DN indicating the level of the ground voltage GND and the bit line BN0. The common data lines DT and DN forming a pair and the bit lines BT1 and BN1 forming a pair remain electrically disconnected from each other.

Subsequently, the voltage of the bit line BN0 falls from the level of the intermediate voltage HVDD to the level of the ground voltage GND (time t2 to time t4). On the other hand, the voltage of the bit line BT0 maintains the level of the intermediate voltage HVDD (time t2 to time t3).

The column selection signal Y0 makes transition, and subsequently the voltage of the word line WL0 connected to the target memory cell, MC00, rises (time t3). Thus, the transistor SW00 is turned on, so that charge sharing occurs between the capacitor C00, in which the data "0" is stored, and the bit line BT0. As a result, the voltage of the bit line BT0 falls slightly (about 300 mV) from the level of the intermediate voltage HVDD (time t3 to time t4).

Note that the transistor YN0 disposed between the common data line DN indicating the level of the ground voltage GND and the bit line BN0 has a relatively low on-resistance. For this reason, the voltage of the bit line BN0 quickly falls to the level of the ground voltage GND, regardless of the data stored in the memory cell MC10. On the other hand, the transistor YT0 disposed between the common data line DT indicating the level of the intermediate voltage HVDD and the bit line BT0 has a relatively high on-resistance. Specifically, when the voltage of the bit line BT0 is at a level around the intermediate voltage HVDD, the transistor YT0 is cut off. Accordingly, the bit line BT0 maintains a level around the intermediate voltage HVDD.

The transistor SW01, which is disposed in a non-target memory cell, MC01, is also turned on, so that charge sharing occurs between the capacitor C01, in which the data "1" is stored, and the bit line BT1. Accordingly, the voltage of the bit line BT1 rises from the intermediate voltage HVDD (time t3 to time t4).

Subsequently, the sense amplifier activation signal SEN rises, and the sense amplifier activation signal SEP falls (time t5). Thus, the sense amplifiers SA0 and SA1 are both activated and then start amplifying the potential difference between the bit lines BT0 and BN0 forming a pair and the potential difference between the bit lines BT1 and BN1 forming a pair, respectively. At this time, both the voltages of the nodes SAN0 and SAN1 fall to the level of the ground voltage GND.

Through the amplification operation, the sense amplifier SA0 raises the voltage of the bit line BT0 to the level of the power supply voltage VDD and lowers (maintains) the voltage of the bit line BN0 to the level of the ground voltage GND (time t6). On the other hand, through the amplification operation, the sense amplifier SA1 raises the voltage of the bit line BT1 to the level of the power supply voltage VDD and lowers the voltage of the bit line BN1 to the level of the ground voltage GND.

As a result, the data "1" is written to the memory cell MC00. On the other hand, the read data "1" is written to the memory cell MC01 again.

Subsequently, the column selection signal Y0 falls (time t7), and the word line WL0 falls (time t8). Thus, the semiconductor storage apparatus 1 according to the present embodiment completes the early write-type data write.

Note that the column selection gate (CS0 in the example of FIG. 4) may be turned on before the word lines are activated, as long as it is turned on after the pair of bit lines is pre-charged.

As seen above, in the early write-type data write operation, as compared to in the normal data write operation, the column selection gate corresponding to the target memory cell is turned on before the sense amplifier is activated. This eliminates the need for the memory cell to amplify the data stored therein, allowing speed-up of the operation and a reduction in power consumption. In the early write-type data write operation, as compared to in the normal data write operation, the potential difference between the bit lines forming a pair corresponding to the target memory cell is small. Thus, noise between unselected bit lines forming a pair is suppressed.

Further, instead of causing a small-amplitude potential difference centered on the intermediate voltage HVDD between the common data lines DT and DN forming a pair as in the traditional semiconductor storage apparatus, the semiconductor storage apparatus 1 according to the present embodiment, in accordance with the data to be written, sets the voltage of one of the common data lines DT and DN forming a pair to the level of the ground voltage GND and maintains the voltage of the other common data line at the intermediate voltage HVDD. Thus, even when the power supply voltage is a low voltage of 1.2 V or less, the semiconductor storage apparatus 1 according to the present embodiment can turn on a column selection gate by simply providing a column selection signal indicating the level of the power supply voltage VDD to the column selection gate. That is, small-amplitude input is possible. In other words, unlike traditional semiconductor storage apparatuses, the semiconductor storage apparatus 1 according to the present embodiment does not need to provide, to a column selection gate, a column selection signal having a voltage level higher than the power supply voltage VDD. Accordingly, the semiconductor storage apparatus 1 according to the present embodiment eliminates the need to separately include a booster circuit, allowing prevention of an increase in circuit size. Further, the transistors included in the column selection gates do not need to be high-voltage transistors.

Further, in the semiconductor storage apparatus 1 according to the present embodiment, the sense amplifier NMOS drivers SDN0 to SDNn serving as switching elements are disposed between the sense amplifiers SA0 to SAn and the ground voltage terminals GND. Effects thereof will be described in detail below.

Figure 5:
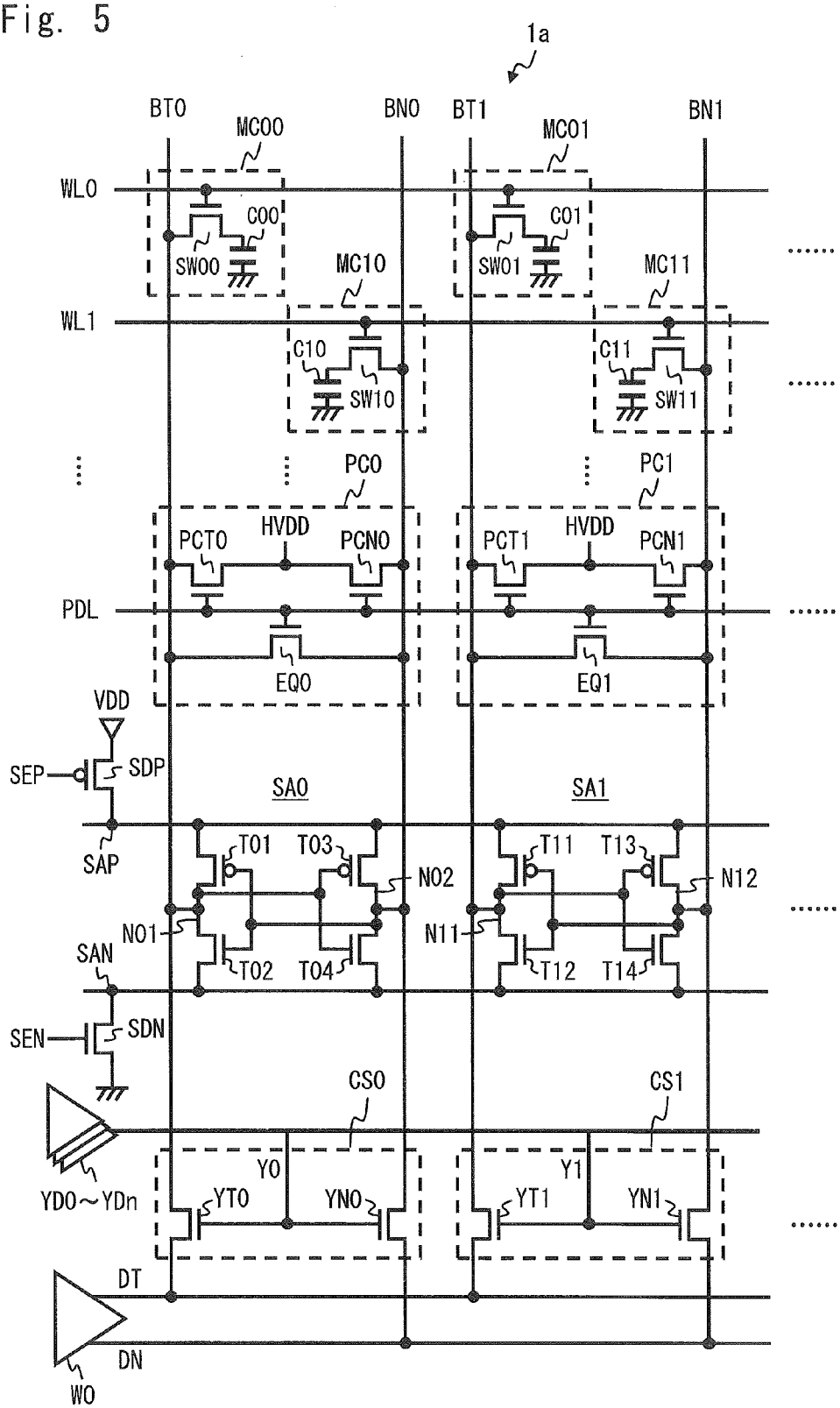
FIG. 5 is a circuit diagram showing a semiconductor storage apparatus according to a concept before achieving an embodiment.

FIG. 5 is a diagram showing a semiconductor storage apparatus 1a according to a concept before achieving the present embodiment. Compared to the semiconductor storage apparatus 1, the semiconductor storage apparatus 1a is provided with a common sense amplifier NMOS driver SDN, instead of the sense amplifier NMOS drivers SDN0 to SDN1, between sense amplifiers SA0 and SA1 and a ground voltage terminal GND. The other circuit components of the semiconductor storage apparatus 1a are similar to those of the semiconductor storage apparatus 1 and therefore will not be described.

Next, the operation of the semiconductor storage apparatus 1a will be described. Since the preconditions and basic operation are similar to those in the early write-type operation of the semiconductor storage apparatus 1, a problem which can occur in the semiconductor storage apparatus 1a will be described.

For example, assume that in the semiconductor storage apparatus 1a, before the sense amplifiers SA0 and SA1 are activated, a column selection gate Y0 rises; a column selection gate Y1 maintains an L level; and the common data line DN receives a signal having the level of the ground voltage GND as an L-level signal. Thus, a column selection gate CS0 is turned on, and a column selection gate CS1 remains off. More specifically, electrical connection is made at least between a common data line DN indicating the level of the ground voltage GND and a bit line BN0. The common data lines DT and DN forming a pair and the bit lines BT1 and BN1 forming a pair remain electrically disconnected from each other.

At this time, a sense amplifier activation signal SEN indicating an L level is provided to the sense amplifier NMOS driver SDN, which is then turned off. Accordingly, a common node SAN is electrically floating. On the other hand, the bit line BN0 is electrically connected to the common data line DN indicating the level of the ground voltage GND. Accordingly, a node N02 (the source of a transistor T04) indicates the level of the ground voltage GND. A node N01 (the gate of the transistor T4) indicates the level of the intermediate voltage HVDD. For this reason, the transistor T04 included in the sense amplifier SA0 may be turned on. The voltage of the common node SAN may be lowered, and the unselected sense amplifier, SA1, which has yet to be activated, may unintentionally start an amplification operation. In such a case, the sense amplifier SA1 starts amplifying the potential difference between the bit lines BT1 and BN1 forming a pair, which is not sufficiently large. Accordingly, if the potential difference is smaller than an offset voltage, the sense amplifier SA1 may malfunction (see FIG. 4).

On the other hand, the semiconductor storage apparatus 1 shown in FIG. 1 is provided with the sense amplifier NMOS driver SDN0 and SDN1 between the sense amplifiers SA0 and SA1 and the ground voltage terminals GND. Thus, in the semiconductor storage apparatus 1, no sneak current flows from the sense amplifier SA0 to the sense amplifier SA1. This prevents the unselected sense amplifier, SA1, which has yet to be activated, from unintentionally starting an amplification operation. That is, normal operation of the sense amplifier SA1 is guaranteed.

Note that none of the voltages of bit lines BT0 and BN0 forming a pair does not rise to the level of the power supply voltage VDD before the sense amplifiers SA0 and SA1 are activated. As a result, it is unlikely that the p-channel MOS transistors (T01, T03) included in the sense amplifier SA0 will be unintentionally turned on. For this reason, the semiconductor storage apparatus 1 according to the present embodiment is provided with the sense amplifier PMOS driver SDP, instead of separate transistors, between the sense amplifiers SA0 and SA1 and the power supply voltage terminal VDD.

In the semiconductor storage apparatus 1 according to the present embodiment, the sense amplifiers SA0 to SAn do not need to perform amplification operations with time differences and may perform amplification operations simultaneously. Further, the semiconductor storage apparatus 1 can perform a data write operation at a short interval, like a data read operation or refresh operation, (as used herein, the interval refers to the interval between the timing when a word line is selected and the timing when a sense amplifier is activated).

The semiconductor storage apparatus 1 according to the present embodiment is provided with the larger number of transistors between the sense amplifiers SA0 to SAn and the ground voltage terminals GND than the semiconductor storage apparatus 1a. However, the effect of the increase in circuit size is reduced by embedding the sense amplifier NMOS drivers SDN0 to SDNn in the sense amplifiers SA0 to SAn, respectively. The reason is that the total capability (SW) of the sense amplifier NMOS drivers SDN0 to SDNn only has to be the same as that of the common sense amplifier NMOS driver SDN.

In a data read operation, the semiconductor storage apparatus 1 according to the present embodiment selectively turns on a column selection gate after activating sense amplifiers, as in FIG. 3. Subsequently, data read according to the potential difference between the common data lines DT and DN forming a pair is outputted. Note that the data read speed is determined by the speed of increase in the potential difference between the common data lines DT and DN forming a pair. The cycle of a data read operation is determined by an operation in which one of a pair of bit lines restores the level of the power supply voltage VDD and in which the other bit line restores the level of the ground voltage GND (restore operation). Accordingly, the data read cycle and the data write cycle may be the same.

Second Embodiment

Figure 6:
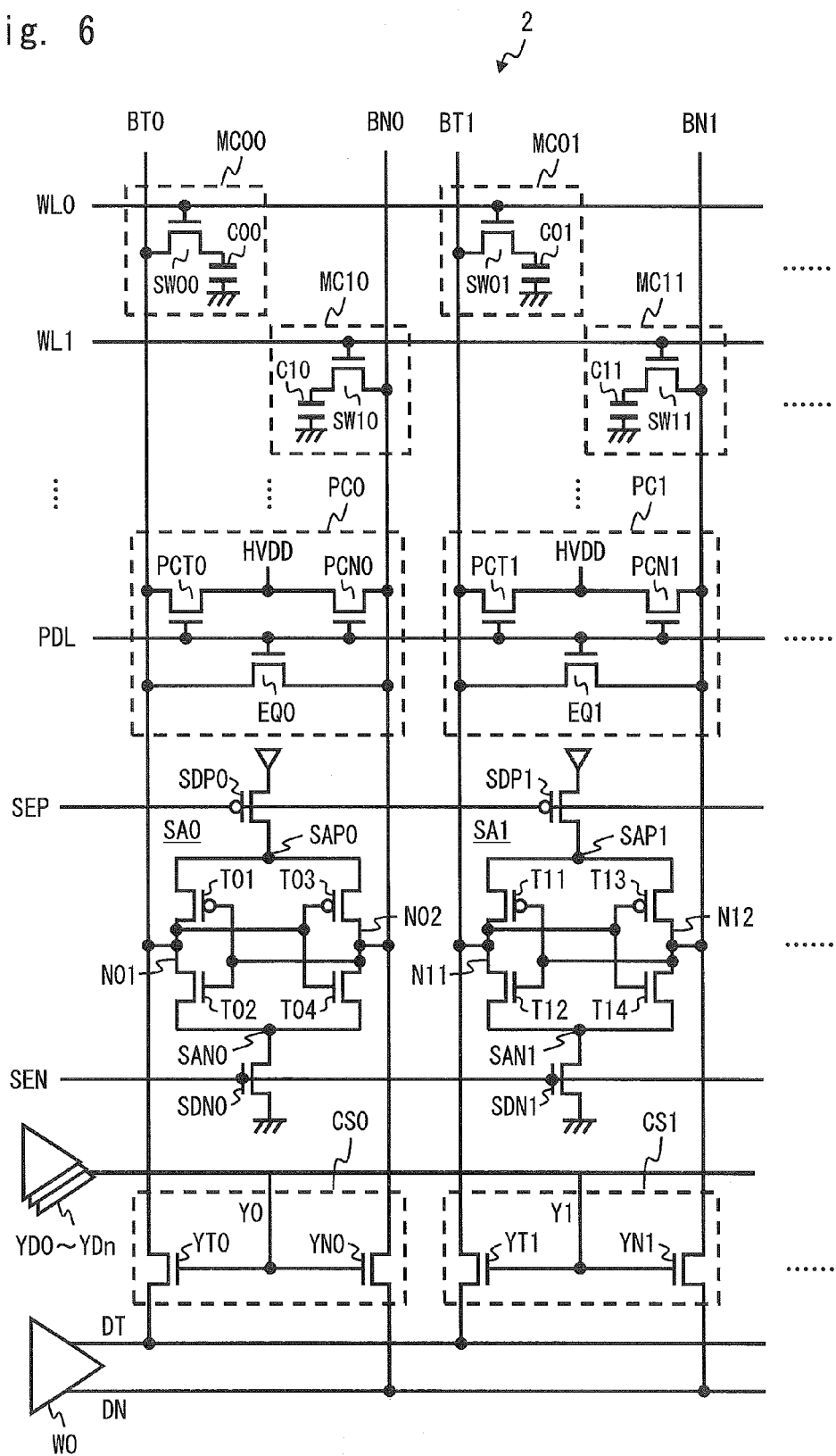
FIG. 6 is a circuit diagram showing an example configuration of a semiconductor storage apparatus according to a second embodiment.

FIG. 6 is a circuit diagram showing an example configuration of a semiconductor storage apparatus 2 according to a second embodiment. Compared to the semiconductor storage apparatus 1 shown in FIG. 1, the semiconductor storage apparatus 2 shown in FIG. 6 is provided with separate sense amplifier PMOS drivers (second switching elements) SDP0 to SDPn, instead of the common sense amplifier PMOS driver SDP, between sense amplifiers SA0 to SAn and power supply voltage terminals VDD. The other circuit components of the semiconductor storage apparatus 2 are similar to those of the semiconductor storage apparatus 1 and therefore will not be described.

As the power supply voltage is reduced in recent years, the on-margin of the sense amplifiers SA0 to SAn has been narrowed. For this reason, in the configuration of the semiconductor storage apparatus 1 shown in FIG. 1 (a configuration in which the common sense amplifier PMOS driver SDP is disposed), unevenness in the potential difference among the pairs of bit lines or unevenness in the threshold voltage among the transistors included in the sense amplifiers may allow current to pass intensively through a transistor which is most easily turned on. Thus, a sense amplifier which does not easily operate may perform an amplification operation with further delay.

To avoid such a phenomenon, the semiconductor storage apparatus 2 according to the present embodiment is provided with the sense amplifier PMOS drivers SDP0 to SDPn, which are on-off controlled by a sense amplifier activation signal SEP, between the sense amplifiers SA0 to SAn and the power supply voltage terminals VDD. Thus, the semiconductor storage apparatus 2 prevents current from passing intensively through a transistor which is most easily turned on, thereby preventing a sense amplifier which does not easily operate from performing an amplification operation with further delay. That is, the semiconductor storage apparatus 2 according to the present embodiment can speed up an operation more stably even when the power supply voltage VDD is low.

Third Embodiment

Figure 7:
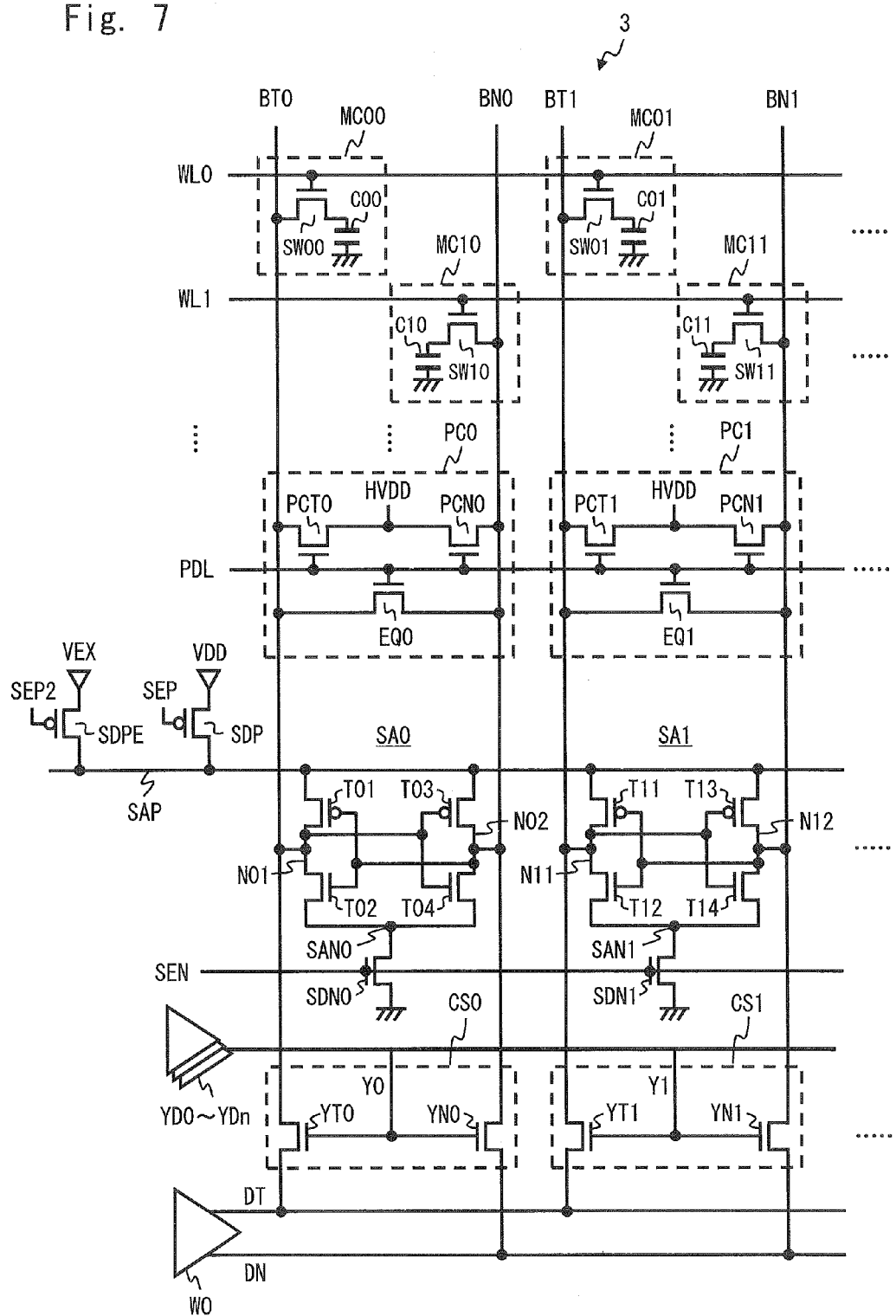
FIG. 7 is a circuit diagram showing an example configuration of a semiconductor storage apparatus according to a third embodiment.

FIG. 7 is a circuit diagram showing an example configuration of a semiconductor storage apparatus 3 according to a third embodiment. Compared to the semiconductor storage apparatus 1 shown in FIG. 1, the semiconductor storage apparatus 3 shown in FIG. 7 is further provided with a sense amplifier PMOS driver (third switching element) SDPE for overdrive between sense amplifiers SA0 to SAn and a power supply voltage terminal to which a power supply voltage VEX higher than the power supply voltage VDD is provided (hereafter referred to as the power supply voltage terminal VEX). The other circuit components of the semiconductor storage apparatus 3 are similar to those of the semiconductor storage apparatus 1 and therefore will not be described.

To activate the sense amplifiers SA0 to SAn, the semiconductor storage apparatus 3 turns on the sense amplifier NMOS drivers SDN0 to SDNn and simultaneously turns on both the common sense amplifiers PMOS drivers SDP and SDPE, and subsequently turns off only the sense amplifier PMOS driver SDPE. Thus, the semiconductor storage apparatus 3 can temporarily raise the voltage of a node SAP to the level of the high voltage VEX to increase the reaction speed of the p-channel MOS transistors included in the sense amplifiers SA0 to SAn. That is, the semiconductor storage apparatus 3 according to the present embodiment can more quickly activate the sense amplifiers SA0 to SAn.

The semiconductor storage apparatus 3 according to the present embodiment can speed up an operation particularly effectively when the power supply voltage VDD is low.

Note that to apply the present embodiment to the configuration of FIG. 6, sense amplifier PMOS drivers SDPE0 to SDPEn must be disposed between the sense amplifiers SA0 to SAn and power supply voltage terminals VEX. In this case, attention must be paid to an increase in circuit size.

Fourth Embodiment

Figure 8:
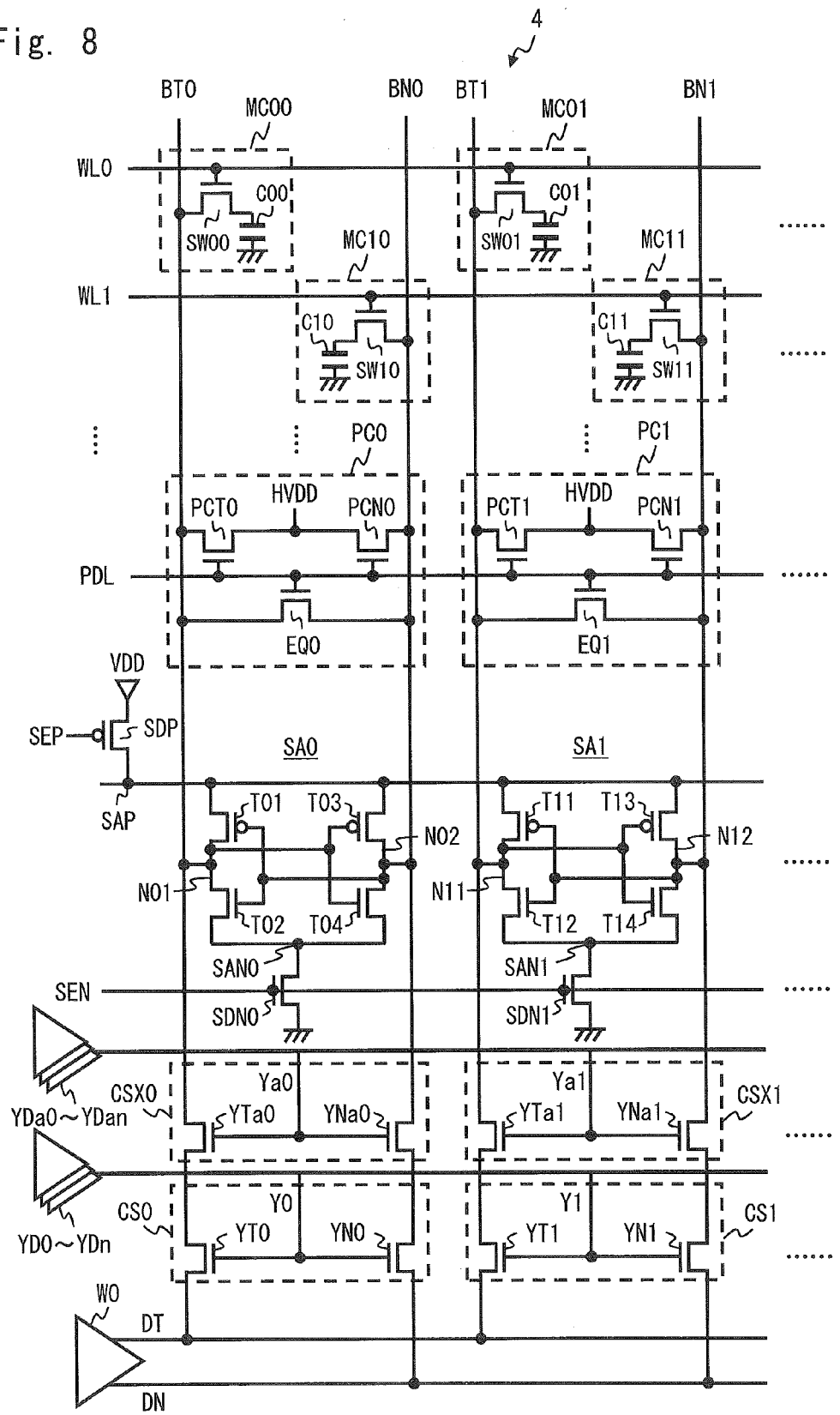
FIG. 8 is a circuit diagram showing an example configuration of a semiconductor storage apparatus according to a fourth embodiment.

FIG. 8 is a circuit diagram showing an example configuration of a semiconductor storage apparatus 4 according to a fourth embodiment. Compared to the semiconductor storage apparatus 1 shown in FIG. 1, the semiconductor storage apparatus 4 shown in FIG. 8 is further provided with mask selection gates CSX0 to CSXn which are vertically stacked on column selection gates CS0 to CSn. To simplify the description, assume that n=1.

The mask selection gates CSX0 includes transistors YTa0 and YNa0. In this embodiment, it is assumed that the transistors YTa0 and YNa0 are n-channel MOS transistors. The transistor YTa0 is disposed between the drain of a transistor YT0 and a bit line BT0 and turned on or off on the basis of a mask selection signal Ya0. The transistor YNa0 is disposed between the drain of a transistor YN0 and a bit line BN0 and turned on or off on the basis of the mask selection signal Ya0.

The mask selection gates CSX1 includes transistors YTa1 and YNa1. In this embodiment, it is assumed that the transistors YTa1 and YNa1 are n-channel MOS transistors. The transistor YTa1 is disposed between the drain of a transistor YT1 and a bit line BT1 and turned on or off on the basis of a mask selection signal Ya1. The transistor YNa1 is disposed between the drain of a transistor YN1 and a bit line BN1 and turned on or off on the basis of the mask selection signal Ya1.

The semiconductor storage apparatus 4 has a data mask function of masking data to be written to a memory cell. For example, the semiconductor storage apparatus 4 masks pieces of data to be written to some memory cells, of multiple pieces of data to be written to multiple memory cells. A detailed description will be made.

For example, a plurality of column selection gates receiving a common column selection signal are simultaneously turned on. In a normal data write operation, it is possible to mask pieces of data to be written to memory cells corresponding to some of the column selection gates receiving the common column selection signal by setting, to an H level, both the voltages of common data lines forming each pair corresponding to some of the column selection gates.

On the other hand, in an early write-type data write operation, before sense amplifiers are activated, a plurality of column selection gates receiving a common column selection signal are simultaneously turned on. Accordingly, when both the voltages of common data lines forming each pair corresponding to some of the column selection gates receiving the common column selection signal are set to an H level, the voltages of the corresponding bit lines forming each pair become about an H level, regardless of data stored in the memory cell. As a result, in the early write-type data write operation, data to be written cannot be masked even when the same method as that of the normal data write operation is used.

For this reason, in addition to the column selection gates CS0 to CSn, the semiconductor storage apparatus 4 according to the present embodiment is provided with mask selection gates CSX0 to CSXn for selectively masking data to be written. Thus, the semiconductor storage apparatus 4 according to the present embodiment can freely mask the data to be written to the target memory cell, regardless of whether the column selection gates CS0 to CSn are on or off.

Figure 9:
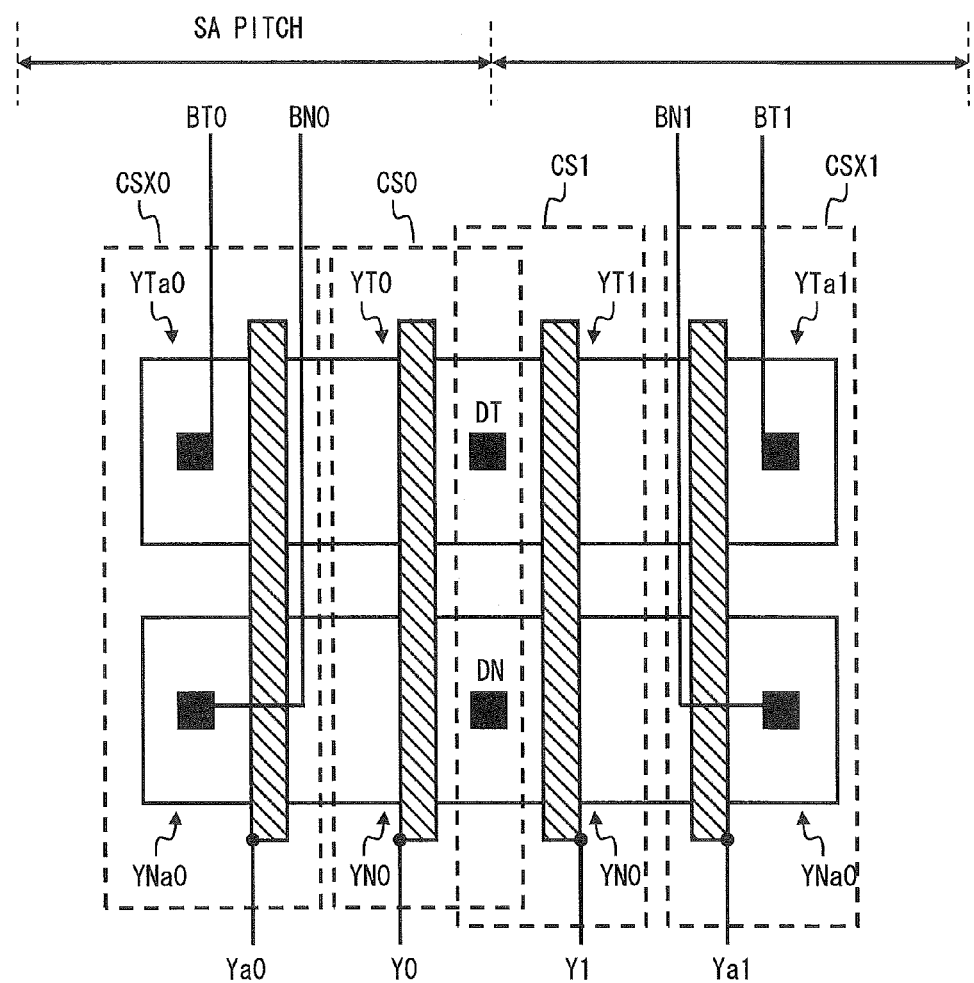
FIG. 9 is a diagram showing a disposition example of column selection gates included in the semiconductor storage apparatus according to the fourth embodiment.

FIG. 9 is a diagram showing a disposition example of the column selection gates CS0 and CS1 and the mask selection gates CSX0 and CSX1. In an upper portion of FIG. 9, the transistors YTa0, YT0, YT1, and YTa1 are disposed in this order from left to right. In a lower portion of FIG. 9, the transistors YNa0, YN0, YN1, and YNa1 are disposed in this order from left to right.

In FIG. 9, the vertically stacked transistors YTa0 and YT0 and the vertically stacked transistors YT1 and YTa1 are sequentially horizontally disposed. The vertically stacked transistors YNa0 and YN0 and the vertically stacked transistors YN1 and YNa1 are sequentially horizontally disposed. Thus, the semiconductor storage apparatus 4 according to the present embodiment can effectively prevent an increase in circuit size, as well as can reduce, to a negligible extent, the effect of offset noise caused by the capacitance of a floating dispersion layer formed between the vertically stacked transistors.

In the present embodiment, the example has been described in which the semiconductor storage apparatus 4 includes the mask selection gates CSX0 to CSXn. The configuration of the semiconductor storage apparatus 4 is not limited to this example. Instead of including the mask selection gates CSX0 to CSXn, the semiconductor storage apparatus 4 may generate column selection signals Y0' to Yn' on the basis of the column selection signals Y0 to Yn and the mask selection signals Ya0 to Yan and then provide the column selection signals Y0' to Yn' to the column selection gates CS0 to CSn, respectively.

Fifth Embodiment

Figure 10:
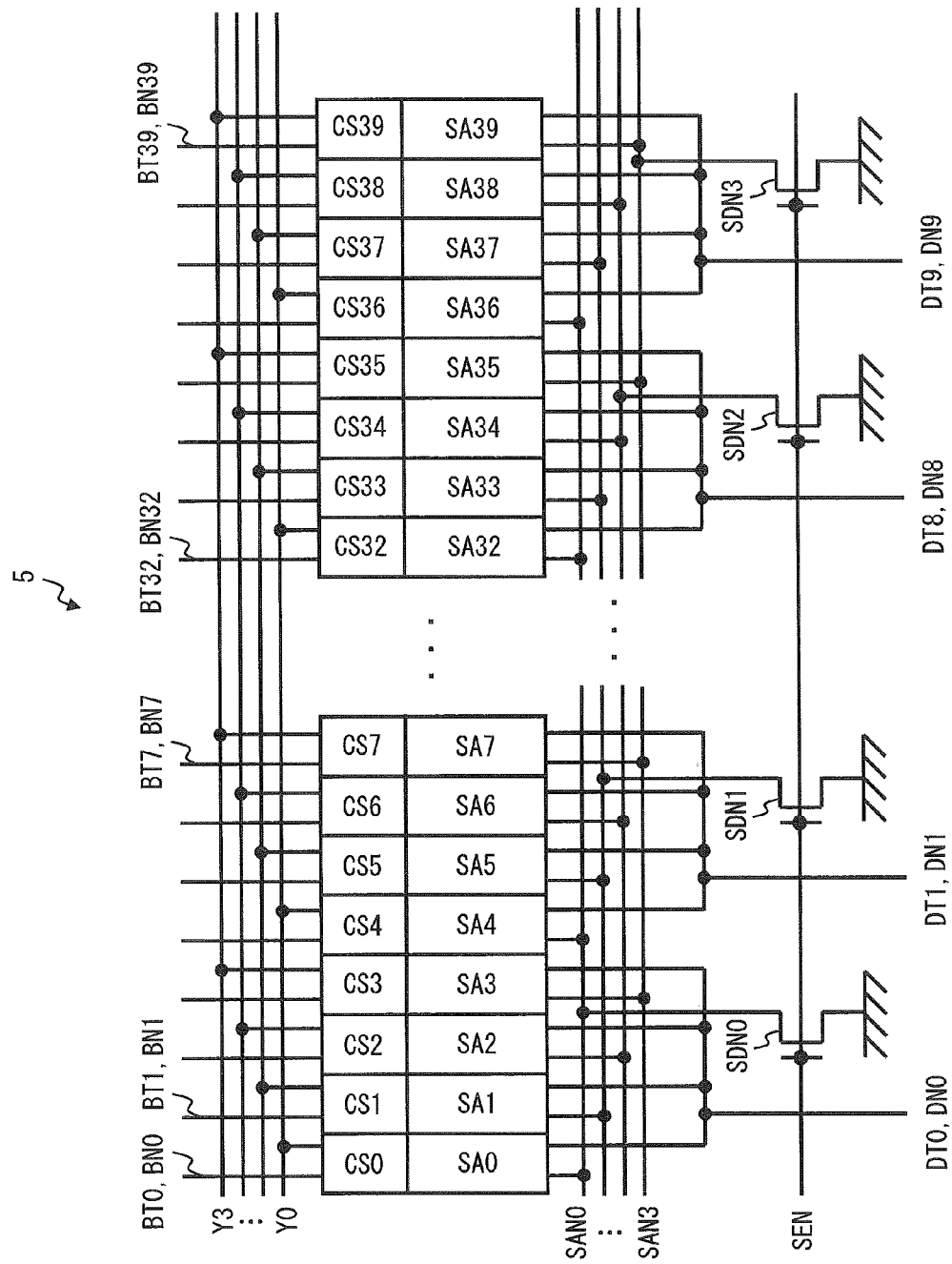
FIG. 10 is a diagram showing an example configuration of a semiconductor storage apparatus according to a fifth embodiment.

FIG. 10 is a diagram showing an example configuration of part of a semiconductor storage apparatus 5 according to a fifth embodiment. The semiconductor storage apparatus 5 shown in FIG. 10 is provided with a common transistor between sense amplifiers corresponding to simultaneously selected columns and ground voltage terminals GND. Assuming that n=39, a detailed description will be made.

Ten column selection gates CS0, CS4, . . . , and CS36 (hereafter referred to as the first group of column selection gates) are simultaneously turned on or off on the basis of a common column selection signal Y0. That is, the first group of column selection gates correspond to simultaneously selected columns. Ten column selection gates CS1, CS5, . . . , and CS37 (hereafter referred to as the second group of column selection gates) are simultaneously turned on or off on the basis of a common column selection signal Y1. That is, the second group of column selection gates correspond to simultaneously selected columns. Ten column selection gates CS2, CS6, . . . , and CS38 (hereafter referred to as the third group of column selection gates) are simultaneously turned on or off on the basis of a common column selection signal Y2. That is, the third group of column selection gates correspond to simultaneously selected columns. Ten column selection gates CS3, CS7, . . . , and CS39 (hereafter referred to as the fourth group of column selection gates) are simultaneously turned on or off on the basis of a common column selection signal Y3. That is, the fourth group of column selection gates correspond to simultaneously selected columns.

The semiconductor storage apparatus 5 also includes pairs of common data lines DT0 and DN0 to DT9 and DN9 and data-to-be-written output circuits WO0 to WO9 (not shown) configured to provide, to the pairs of common data lines, voltages corresponding to data to be written. The data-to-be-written output circuits WO0 to WO9 have a function similar to that of the data-to-be-written output circuit WO.

The pair of common data lines DT0 and DN0 is connected to four column selection gates, CS0 to CS3. The pair of common data lines DT1 and DN1 is connected to four column selection gates, CS4 to CS7. The pair of common data lines DT2 and DN2 is connected to four column selection gates, CS8 to CS11. The pair of common data lines DT3 and DN3 is connected to four column selection gates, CS12 to CS15. The pair of common data lines DT4 and DN4 is connected to four column selection gates, CS16 to CS19. The pair of common data lines DT5 and DN5 is connected to four column selection gates, CS20 to CS23. The pair of common data lines DT6 and DN6 is connected to four column selection gates, CS24 to CS27. The pair of common data lines DT7 and DN7 is connected to four column selection gates, CS28 to CS31. The pair of common data lines DT8 and DN8 is connected to four column selection gates, CS32 to CS35. The pair of common data lines DT9 and DN9 is connected to four column selection gates, CS36 to CS39.

Further, a common sense amplifier NMOS driver SDN0 which is on-off controlled on the basis of a sense amplifier activation signal SEN is disposed between the sense amplifiers SA0, SA4, . . . , and SA36 corresponding to the first group of column selection gates (that is, corresponding to simultaneously selected columns; hereafter referred to as the first group of sense amplifiers) and a ground voltage terminal GND. A common sense amplifier NMOS driver SDN1 which is on-off controlled on the basis of the sense amplifier activation signal SEN is disposed between the sense amplifiers SA1, SA5, . . . , and SA37 corresponding to the second group of column selection gates (that is, corresponding to simultaneously selected columns; hereafter referred to as the second group of sense amplifiers) and a ground voltage terminal GND. A common sense amplifier NMOS driver SDN2 which is on-off controlled on the basis of the sense amplifier activation signal SEN is disposed between the sense amplifiers SA2, SA6, . . . , and SA38 corresponding to the third group of column selection gates (that is, corresponds to simultaneously selected columns; hereafter referred to as the third group of sense amplifiers) and a ground voltage terminal GND. A common sense amplifier NMOS driver SDN3 which is on-off controlled on the basis of the sense amplifier activation signal SEN is disposed between sense amplifiers the SA3, SA7, . . . , and SA39 corresponding to the fourth group of column selection gates (that is, corresponding to simultaneously selected columns; hereafter referred to as the fourth group of sense amplifiers) and a ground voltage terminal GND.

For example, when a column selection gate Y0 rises, the first group of column selection gates (column selection gates CS0, CS4, . . . , and CS36) are all turned on. Subsequently, when the sense amplifier activation signal SEN rises, the sense amplifiers SA0 to SA39 simultaneously start amplification operations. At this time, the first group of sense amplifiers (sense amplifiers SA0, SA4, . . . , and SA36) amplify the pairs of common data lines DT0 and DN0 to DT9 and DN9, respectively, and write the amplified potential differences to the corresponding memory cells.

As seen above, the semiconductor storage apparatus 4 according to the present embodiment is provided with the common transistors between the groups of sense amplifiers (the first to fourth groups of sense amplifiers), which each correspond to simultaneously selected columns, and the ground voltage terminals GND. Thus, the semiconductor storage apparatus 4 according to the present embodiment can reduce the number of transistors as compared to the semiconductor storage apparatus 1 shown in FIG. 1, thereby further preventing an increase in circuit size.

A sense amplifier corresponding to a selected column (for example, the sense amplifier SA0) and a sense amplifier corresponding to an unselected column (for example, the sense amplifier SA1) are connected to the ground voltage terminals GND via different sense amplifier NMOS drivers (SDN0, SDN1). Thus, in the semiconductor storage apparatus 4, as in the semiconductor storage apparatus 1, no sneak current flows from the sense amplifier corresponding to the selected column to the sense amplifier corresponding to the unselected column. Accordingly, the sense amplifier corresponding to the unselected column (SA1) does not unintentionally start an amplification operation. That is, normal operation of the sense amplifier corresponding to the unselected column is guaranteed.

In the present embodiment, the example has been described in which the sense amplifiers SA0 to SAn are classified into four groups of sense amplifiers; however, the sense amplifiers may be classified into any number of groups. In this case, the number or the like of the column selection signals, the pairs of common data lines, the data-to-be-written output circuits, or the transistors for controlling activation of a sense amplifier is changed as appropriate.

In the present embodiment, the example has been described in which the semiconductor storage apparatus 5 does not include the mask selection gates CSX0 to CSXn; however, the semiconductor storage apparatus 5 is not limited to this example and may include the mask selection gates CSX0 to CSXn. In this case, the mask selection gates CSX0, CSX4, and CSX36 (the first group of mask selection gates) must be simultaneously turned on or off based on the basis of the common mask selection signal Ya0. The mask selection gates CSX1, CSX5, . . . , and CSX37 (the second group of mask selection gates) must be simultaneously turned on or off based on the common mask selection signal Ya1. The mask selection gates CSX2, CSX6, . . . , and CSX38 (the third group of mask selection gates) must be simultaneously turned on or off based on the common mask selection signal Ya2. The mask selection gates CSX3, CSX7, . . . , and CSX39 (the fourth group of mask selection gates) must be simultaneously turned on or off based on the common mask selection signal Ya3.

Sixth Embodiment

Figure 11:
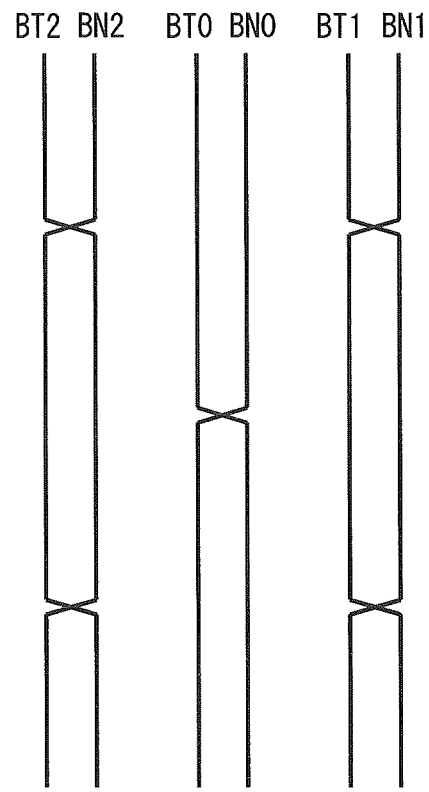
FIG. 11 is a diagram showing a disposition example of pairs of bit line included in a semiconductor storage apparatus according to a sixth embodiment.

In the present embodiment, there will be described an example of the specific disposition of the pairs of bit lines BT0 and BN0 to BTn and BNn included in the semiconductor storage apparatus shown in FIG. 1. FIG. 11 is a diagram showing an example of the specific disposition of pairs of bit lines. Assuming that n=2, a detailed description will be made.

In the example of FIG. 11, the pairs of bit lines BT0 and BN0 to BT2 and BN2 are placed in a twisted manner. Thus, similar degrees of coupling noise occur on one and the other of each pair of bit lines. In this case, the imbalance between coupling noise on one of each pair of bit lines and that on the other bit line is reduced. The twisted placement of the pairs of bit lines shown in FIG. 11 is applicable to the configurations of the first to fifth embodiments.

Seventh Embodiment

Figure 12:
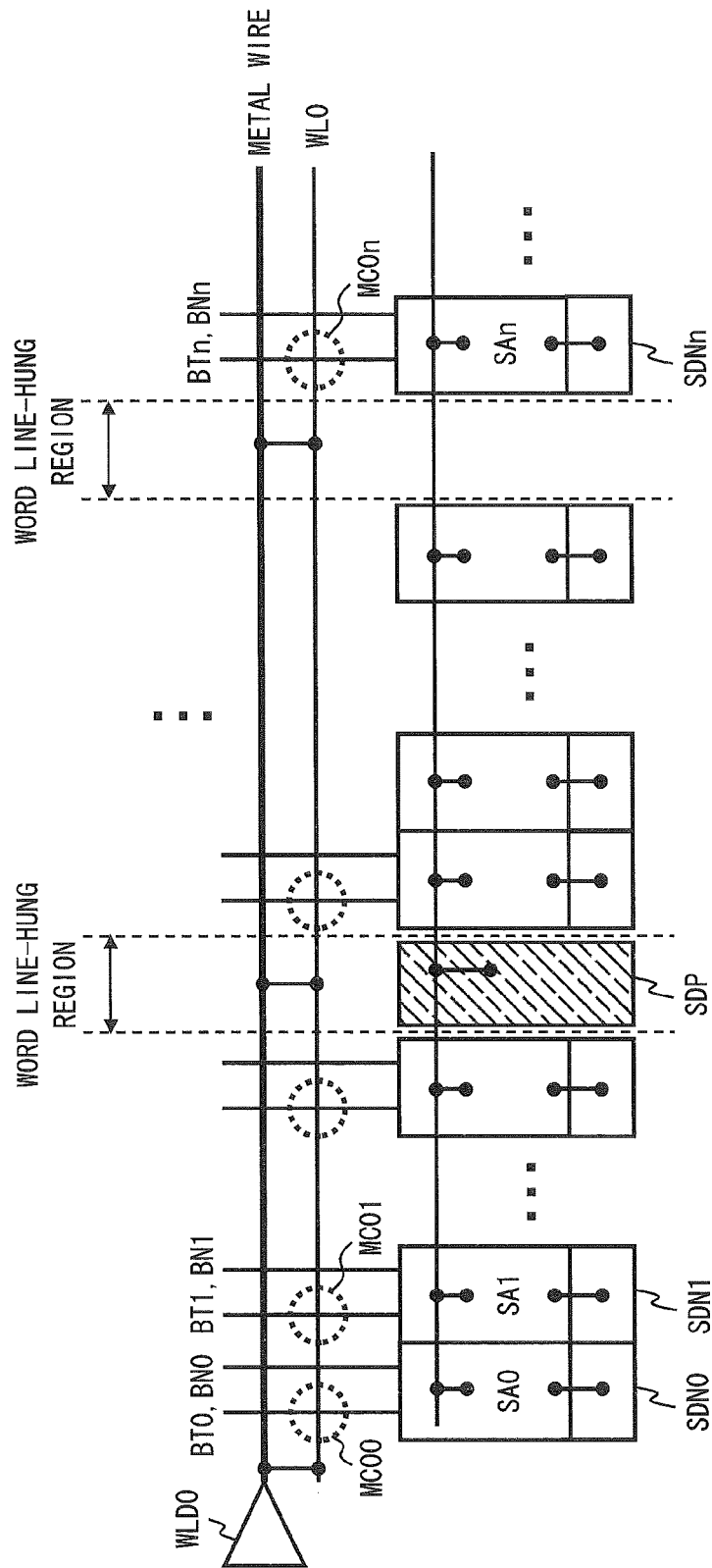
FIG. 12 is a diagram showing a disposition example of a semiconductor storage apparatus according to a seventh embodiment.

In the present embodiment, there will be described an example of the specific disposition of the semiconductor storage apparatus 1 shown in FIG. 1. FIG. 12 is a conceptual diagram showing part of a specific disposition example of the semiconductor storage apparatus 1. A detailed description will be made below. Note that FIG. 12 shows only the word line WL0 of the word lines WL0 to WLm and only the memory cells MC00 to MC0n connected to the word line WL0, of the memory cells MC00 to MCmn.

In FIG. 12, the memory cells MC00 to MC0n are disposed in this order from left to right. Further, the sense amplifiers SA0 to SAn are disposed in this order from left to right in a manner corresponding to the memory cells MC00 to MC0n. Furthermore, the sense amplifier NMOS drivers SDN0 to SDNn are disposed in this order from left to right in a manner corresponding to the sense amplifiers SA0 to SAn.

In FIG. 12, the word line WL0 driven by a word line driver WLD0 is horizontally placed along the memory cells MC00 to MC0n. Further, a low-resistance metal wire serving as a shunt is installed in a layer above the high-resistance word line WL0 along the word line WL0. The word line WL0 and the metal wire are electrically connected together over a predetermined length.

In this case, no memory cell is disposed below the region in which the word line WL0 and the metal wire are electrically connected together (a word line-hung region in FIG. 12). Accordingly, no sense amplifier is disposed in a sense amplifier disposition region corresponding to this word line-hung region. For this reason, the common sense amplifier PMOS driver SDP between the sense amplifiers SA0 to SAn and the power supply voltage terminal VDD is disposed in this empty region. Thus, an increase in circuit size is effectively prevented.

Note that if multiple transistors are disposed between the sense amplifiers SA0 to SAn and the power supply voltage terminal VDD, these transistors are preferably disposed in sense amplifier disposition regions (empty regions) corresponding to multiple word line-hung regions.

Eighth Embodiment

FIG. 13 is a conceptual diagram showing a disposition example of a semiconductor storage apparatus 6 according to an eighth embodiment. Assuming that the configuration of the semiconductor storage apparatus 1 is a single bank, the semiconductor storage apparatus 6 shown in FIG. 13 includes multiple banks BNK0 to BNKx (x is a natural number) which commonly use the pairs of bit lines BT0 and BN0 to BTn and BNn. A detailed description will be made.

Since the banks BNK0 to BNKx have the same configuration, FIG. 13 shows only the configuration of the bank BNK0. Further, FIG. 13 shows only the word line WL0 of the word lines WL0 to WLm and only the memory cells MC00 to MC0n connected to the word line WL0, of the memory cells MC00 to MCmn.

In FIG. 13, the memory cells MC00 to MC0n are disposed in this order from left to right. Sense amplifiers SA0 to SAn and column selection gates CS0 to CSn are disposed in this order from left to right in a manner corresponding to the memory cells MC00 to MC0n.

In FIG. 13, the word line WL0 is horizontally placed along the memory cells MC00 to MC0n. A word line driver WLD0 for driving the word line WL0 is disposed in a region located in the extending direction of the word line WL0, of the regions adjacent to the memory cell disposition region in the bank BNK0. In other words, the word line driver WLD0 is disposed adjacent to the left side of the region in which the memory cells MC00 to MC0n are disposed. Word line drivers WLD1 to WLDm for driving the word lines WL1 to WLm are also disposed in the region in which the word line driver WLD0 is disposed.

In FIG. 13, multiple column selection signal lines through which the column selection signals Y0 to Yn propagate are horizontally disposed along the column selection gates CS0 to CSn. Column selection drivers YD0 to YDn configured to output the column selection signals Y0 to Yn are disposed in a region located in the extending direction of the column selection signal lines, of the regions adjacent to the column selection driver disposition region in the bank BNK0. In other words, the column selection drivers YD0 to YDn are disposed adjacent to the left side of the column selection driver disposition region. In addition to the column selection drivers, a sense amplifier driver for outputting a sense amplifier activation signal, a pre-charge output circuit for outputting a pre-charge signal, and the like are disposed in this region (these components are not shown).

The column selection drivers YD0 to YDn only have to be able to output column selection signals Y0 and Y1 indicating a maximum level of the power supply voltage VDD and therefore do not need to include large-size, high-voltage transistors. Thus, the semiconductor storage apparatus 6 according to the present embodiment can prevent an increase in the circuit size of the bank BNK0. The same applies to the other banks, BNK1 to BNKx.

Further, the semiconductor storage apparatus 6 according to the present embodiment is provided with the column selection drivers in each of the banks BNK1 to BNKx and therefore can selectively operate only one of the banks BNK1 to BNKx. Further, unlike traditional semiconductor storage apparatuses, the semiconductor storage apparatus 6 according to the present embodiment does not need to output the column selection signals Y0 to Yn indicating a voltage level higher than the power supply voltage VDD. That is, the semiconductor storage apparatus 6 according to the present embodiment can make the amplitude of the column selection signals Y0 to Yn smaller than that of traditional semiconductor storage apparatuses. As a result, the semiconductor storage apparatus 6 according to the present embodiment can prevent an increase in power consumption and reduce noise.

In traditional configurations, where a column selection signal indicating a voltage level higher than the power supply voltage VDD is outputted, a column selection driver must include a large-size, high-voltage transistor. For this reason, the traditional configurations suffer an increase in the circuit size of each bank. To avoid this problem, assuming that a configuration where multiple banks commonly use column selection drivers (see FIG. 14) is employed, all the banks must be simultaneously operated. Further, a column selection signal has a large amplitude. For these reasons, this configuration suffers an increase in power consumption, as well as an increase in noise.

In the present embodiment, the example has been described in which the configuration of each of the banks BNK0 to BNKx is similar to that of the semiconductor storage apparatus 1. However, the configuration of each of the banks BNK0 to BNKx is not limited to this example and may be those of the semiconductor storage apparatuses according to the other embodiments.

As seen above, the semiconductor storage apparatuses according to the above embodiments are semiconductor storage apparatuses which are driven by the power supply voltage VDD of 1.2 V or less and, in writing data, selectively turn on one of the column selection gates by setting the voltage of each of the column selection signals to the level of the power supply voltage or the level of the ground voltage, before activating multiple sense amplifiers. The voltage of one of the pair of common data lines DT and DN is previously set to the level of the ground voltage GND on the basis of the data to be written. Thus, the semiconductor storage apparatuses according to the above embodiments do not need a booster circuit or the like for turning on a column selection gate and therefore can prevent an increase in circuit size and speed up an operation. Further, in the semiconductor storage apparatuses according to the above embodiments, the column selection drivers or column selection gates do not need to include high-voltage transistors and therefore can further prevent an increase in circuit size. Furthermore, the semiconductor storage apparatuses according to the above embodiments can make the amplitude of the column selection signal smaller than that of traditional semiconductor storage apparatuses and therefore can prevent an increase in power consumption, as well as can suppress noise between bit lines forming a pair.

The device structures of the semiconductor storage apparatuses according to the above embodiments may be of any type and are preferably capacitor on bit line (COB) or capacitor on metal layer (COM), both of which are a stack capacitor structure. In a COB or COM structure, the contact of a cell cylinder is disposed between bit lines and therefore the interval between the bit lines is relatively long. Further, the cell contact itself has a shield effect and therefore the effect of coupling noise between the bit lines is significantly reduced.

In the above embodiments, the examples have been described in which the transistors included in the column selection gates CS0 to CSn are n-channel MOS transistors; however, the transistors may be p-channel MOS transistors. In this case, in writing data, the data-to-be-written output circuit WO sets the voltage of one of the pair of common data lines DT and DN to the level of the power supply voltage VDD in accordance with the data to be written and sets the voltage of the other to the level of the intermediate voltage HVDD. However, the data-to-be-written output circuit WO is not limited to what is described above and only has to be able to set the voltage of one of the pair of common data lines DT and DN to a value higher than a voltage obtained by adding the threshold voltage of the p-channel MOS transistors YT0 and YN0 to the ground voltage GND and to set the voltage of the other common data line to a voltage level lower than that of the one common data line.

In the above embodiments, the examples have been described in which the higher-potential power supply voltage is a power supply voltage VDD of 1.2 V or less and the lower-potential power supply voltage is a ground voltage GND of 0 V. However, the higher-potential and lower-potential power supply voltages are not limited thereto and, for example, the lower-potential power supply voltage may be higher than the ground voltage GND. Differences between Embodiments and Related Technologies In the configurations of Japanese Unexamined Patent Application Publication Nos. 8-96578, 4-153987, and 6-162765, the common transistor is disposed between the sense amplifiers and the ground voltage terminals. For this reason, sneak current may flow from the sense amplifier corresponding to the selected column to a sense amplifier corresponding to an unselected column, thereby allowing the sense amplifier corresponding to the unselected column to unintentionally start an amplification operation. That is, the sense amplifier corresponding to the unselected column may malfunction. Japanese Unexamined Patent Application Publication No. 2000-123574 does not disclose or suggest what number of transistors are disposed between the sense amplifiers and the ground voltage terminals or how the transistors are disposed.

On the other hand, the semiconductor storage apparatuses according to the above embodiments are provided with the separate transistors between the sense amplifiers and the ground voltage terminals. Thus, sneak current as described above does not flow. Accordingly, the sense amplifier corresponding to the unselected column does not start unintentionally performing an amplification operation. That is, malfunction of the sense amplifier corresponding to the unselected column is prevented.

While the present invention has been described in detail based on the embodiments, the invention is not limited thereto. As a matter of course, various changes can be made to the embodiments without departing from the spirit and scope of the invention.

The first to eighth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor storage apparatus comprising:
a plurality of memory cells disposed in a matrix;
a plurality of word lines corresponding to rows of the memory cells;
a plurality of pairs of bit lines corresponding to columns of the memory cells;
a plurality of sense amplifiers configured to amplify a potential difference between the bit lines forming each pair;
a pair of common data lines;
a data-to-be-written output circuit configured to, in writing data, set voltages of the common data lines forming the pair to values corresponding to the data;
a column selection signal output unit configured to output a plurality of column selection signals; and
a plurality of column selection gates disposed between the pairs of bit lines and the pair of common data lines and selectively on-off controlled in accordance with the column selection signals, wherein
in writing the data, the column selection signal output unit selectively turns on one of the column selection gates by setting each of voltages of the column selection signals to one of a level of a higher-potential power supply voltage and a level of a lower-potential power supply voltage, before activating the sense amplifiers.

2. The semiconductor storage apparatus according to claim 1, further comprising a plurality of first switching elements disposed between the sense amplifiers and a lower-potential power supply voltage terminal to which the lower-potential power supply voltage is provided, the first switching elements being configured to switch between activation and inactivation of the corresponding sense amplifiers.

3. The semiconductor storage apparatus according to claim 2, wherein
each of the column selection gates comprises a pair of re-channel MOS transistors disposed between the corresponding pair of bit lines and the pair of common data lines, and
based on the data, the data-to-be-written output circuit sets a voltage of one of the common data lines forming the pair to a value lower than a voltage obtained by subtracting a threshold voltage of the n-channel MOS transistors from the higher-potential power supply voltage and sets a voltage of the other common data line to a value higher than at least the voltage of the one common data line.

4. The semiconductor storage apparatus according to claim 3, wherein based on the data, the data-to-be-written output circuit sets the voltage of the one of the common data lines forming the pair to the level of the lower-potential power supply voltage.

5. The semiconductor storage apparatus according to claim 4, wherein based on the data, the data-to-be-written output circuit sets the voltage of the other of the common data lines forming the pair to a level of an intermediate voltage, the intermediate voltage level being an average of the higher-potential and lower-potential power supply voltages.

6. The semiconductor storage apparatus according to claim 2, further comprising a second switching element commonly disposed between the sense amplifiers and a higher-potential power supply voltage terminal to which the higher-potential power supply voltage is provided, the second switching element being configured to switch between activation and inactivation of the sense amplifiers.

7. The semiconductor storage apparatus according to claim 6, further comprising a third switching element commonly disposed between the sense amplifiers and a high-voltage terminal to which a voltage higher than the higher-potential power supply voltage is provided.

8. The semiconductor storage apparatus according to claim 6, further comprising a plurality of metal wires disposed along the word lines, wherein
the second switching element is disposed in a region corresponding to a region in which the word lines and the metal wires are electrically connected together, of regions in which the sense amplifiers are disposed.

9. The semiconductor storage apparatus according to claim 2, further comprising a plurality of second switching elements disposed between the sense amplifiers and higher-potential power supply voltages to which the higher-potential power supply voltage is provided, the second switching elements being configured to switch between activation and inactivation of the sense amplifiers.

10. The semiconductor storage apparatus according to claim 2, wherein
each of the column selection gates comprises a pair of p-channel MOS transistors disposed between the corresponding pair of bit lines and the pair of common data lines, and
based on the data, the data-to-be-written output circuit sets a voltage of one of the common data line forming the pair to a value higher than a voltage obtained by adding a threshold voltage of the p-channel MOS transistors to the lower-potential power supply voltage and sets a voltage of the other common data line to a value lower than at least the voltage of the one common data line.

11. The semiconductor storage apparatus according to claim 10, wherein based on the data, the data-to-be-written output circuit sets the voltage of the one of the common data lines forming the pair to the higher-potential power supply voltage.

12. The semiconductor storage apparatus according to claim 11, wherein based on the data, the data-to-be-written output circuit sets the voltage of the other of the common data lines forming the pair to a level of an intermediate voltage level, the intermediate voltage level being an average of the higher-potential and lower-potential power supply voltages.

13. The semiconductor storage apparatus according to claim 1, further comprising a first switching element commonly disposed between the sense amplifiers corresponding to a plurality of column selection gates which are simultaneously turned on, of the column selection gates and lower-potential power supply voltage terminals to which the lower-potential power supply voltage is provided, the first switching element being configured to switch between activation and inactivation of the sense amplifiers corresponding to the column selection gates which are simultaneously turned on.

14. The semiconductor storage apparatus according to claim 1, further comprising a plurality of mask selection gates vertically stacked on the column selection gates and selectively on-off controlled in accordance with a plurality of mask signals.

15. The semiconductor storage apparatus according to claim 1, wherein both the bit lines forming each pair are placed in a twisted manner.

16. The semiconductor storage apparatus according to claim 1, comprising a plurality of banks which operate independently of each other, wherein each of the banks comprises at least the memory cells, the word lines, the pairs of bit lines, the sense amplifiers, the pair of common data lines, the data-to-be-written output circuit, the column selection signal output unit, and the column selection gates.

17. The semiconductor storage apparatus according to claim 1, wherein
the higher-potential power supply voltage is 1.2 V or less, and
the lower-potential power supply voltage is a ground voltage.

18. A semiconductor storage apparatus comprising:
a memory cell array having a plurality of memory cells arranged therein;
a plurality of pairs of bit lines corresponding to the memory cells;
a plurality of sense amplifiers corresponding to the pairs of bit lines;
column selection gates corresponding to the pairs of bit lines and configured to select a column of the memory cell array in accordance with a column selection signal; and
a data-to-be-written output circuit configured to set voltages of common data lines forming a pair in accordance with data to be written to the memory cells, wherein
in writing the data, the column selection signal is outputted with the sense amplifiers inactivated so as to select the column of the memory cell array, a potential difference set for the pair of common data lines in writing the data is smaller than a potential difference between the bit lines forming each pair amplified by the sense amplifiers, and an amplitude of the column selection signal is approximately identical to the potential difference between the bit lines forming each pair amplified by the sense amplifiers.

19. The semiconductor storage apparatus according to claim 18, further comprising a plurality of switches corresponding to the sense amplifiers and configured to activate the sense amplifiers on the basis of a sense amplifier activation signal.

20. The semiconductor storage apparatus according to claim 18, wherein a voltage of one of the common data lines forming the pair is set to one of a lower-potential power supply voltage and a higher-potential power supply voltage.

\* \* \* \* \*